United States Patent
Komatsuzaki

(10) Patent No.: US 6,944,042 B2
(45) Date of Patent: Sep. 13, 2005

(54) MULTIPLE BIT MEMORY CELLS AND METHODS FOR READING NON-VOLATILE DATA

(75) Inventor: Katsuo Komatsuzaki, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/334,366

(22) Filed: Dec. 31, 2002

(65) Prior Publication Data

US 2004/0125644 A1 Jul. 1, 2004

(51) Int. Cl.$^7$ .................. G11C 11/22; G11C 11/00; G11C 5/06; G11C 11/34; G11C 7/00
(52) U.S. Cl. ............... 365/145; 365/154; 365/65; 365/181; 365/190; 365/205
(58) Field of Search ................ 365/145, 154, 365/65, 181, 190, 205, 185.08

(56) References Cited

U.S. PATENT DOCUMENTS

| | | | |
|---|---|---|---|
| 4,716,552 A | * 12/1987 | Maltiel et al. ............... | 365/222 |
| 4,809,225 A | 2/1989 | Dimmler et al. | |
| 4,853,893 A | 8/1989 | Eaton, Jr. et al. | |
| 4,980,859 A | * 12/1990 | Guterman et al. ..... | 365/185.08 |
| 5,097,449 A | * 3/1992 | Cuevas ................... | 365/185.07 |
| 5,491,666 A | * 2/1996 | Sturges ..................... | 365/201 |
| 5,623,442 A | * 4/1997 | Gotou et al. .......... | 365/185.08 |
| 5,680,344 A | 10/1997 | Seyyedy | |
| 5,923,582 A | * 7/1999 | Voss ............................ | 365/154 |
| 5,995,409 A | * 11/1999 | Holland ...................... | 365/149 |
| 6,009,011 A | * 12/1999 | Yamauchi ............... | 365/185.01 |
| 6,069,816 A | 5/2000 | Nishimura | |
| 6,122,197 A | * 9/2000 | Sinai et al. ............. | 365/185.22 |
| 6,137,716 A | * 10/2000 | Wik ....................... | 365/185.01 |
| 6,141,242 A | 10/2000 | Hsu et al. | |
| 6,222,765 B1 | * 4/2001 | Nojima ................... | 365/185.08 |
| 6,259,126 B1 | 7/2001 | Hsu et al. | |
| 6,263,398 B1 | 7/2001 | Taylor et al. | |
| 6,285,575 B1 | 9/2001 | Miwa | |
| 6,297,989 B1 | * 10/2001 | Cloud et al. ........... | 365/185.08 |
| 6,363,011 B1 | * 3/2002 | Hirose et al. .......... | 365/185.07 |
| 6,370,058 B1 | * 4/2002 | Fukumoto .............. | 365/185.08 |
| 6,414,873 B1 | * 7/2002 | Herdt ..................... | 365/185.08 |
| 6,754,108 B2 | * 6/2004 | Forbes ................... | 365/185.25 |
| 2003/0235095 A1 | * 12/2003 | Inoue .......................... | 365/201 |
| 2004/0016947 A1 | * 1/2004 | Choi .......................... | 257/296 |

FOREIGN PATENT DOCUMENTS

| | | | | |
|---|---|---|---|---|
| JP | 05342890 A | * 12/1993 | ........... | G11C/14/00 |
| JP | 06244384 A | * 9/1994 | ......... | H01L/27/108 |
| JP | 07226088 A | * 8/1995 | ........... | G11C/14/00 |
| JP | 411126492 A | * 5/1999 | ........... | G11C/16/04 |
| JP | 2000187989 A | * 7/2000 | ........... | G11C/14/00 |
| JP | 2001057085 A | * 2/2001 | ........... | G11C/14/00 |
| JP | 2003133532 A | * 5/2003 | ......... | H01L/27/105 |
| JP | 2003308691 A | * 10/2003 | ......... | G11C/11/401 |

* cited by examiner

*Primary Examiner*—Hoai Ho
*Assistant Examiner*—Ly Duy Pham
(74) *Attorney, Agent, or Firm*—Jacqueline J. Garner; W. James Brady III; Frederick J. Telecky, Jr.

(57) ABSTRACT

Memory cells are disclosed comprising volatile and non-volatile portions, where the non-volatile portions provide storage of multiple non-volatile data states or bits per memory cell. Methods are provided for reading non-volatile data states from a non-volatile portion of a memory cell into a volatile portion.

8 Claims, 14 Drawing Sheets

MULTIPLE BIT MEMORY CELLS AND METHODS FOR READING NON-VOLATILE DATA

INCORPORATION BY REFERENCE

The disclosure of U.S. patent application Ser. No. 10/293,195 entitled VOLATILE MEMORY WITH NON-VOLATILE FERROELECTRIC CAPACITORS, filed on Nov. 13, 2002, is hereby incorporated by reference as if fully set forth herein.

FIELD OF INVENTION

The present invention relates generally to semiconductor memory devices and more particularly to volatile data memory cells having multi-bit non-volatile storage capability and methods for operation thereof.

BACKGROUND OF THE INVENTION

In semiconductor memory devices, data is read from or written to the memory using address signals and various other control signals. In random access memories ("RAMS"), an individual binary data state (e.g., a bit) is stored in a volatile memory cell, wherein a number of such cells are grouped together into arrays of columns and rows accessible in random fashion along bitlines and wordlines, respectively, wherein each cell is associated with a unique wordline and bitline pair. Address decoder control circuits identify one or more cells to be accessed in a particular memory operation for reading or writing, wherein the memory cells are typically accessed in groups of bytes or words (e.g., generally a multiple of 8 cells arranged along a common wordline). Thus, by specifying an address, a RAM is able to access a single byte or word in an array of many cells, so as to read or write data from or into that addressed memory cell group.

Two major classes of random access memories include "dynamic" (e.g., DRAMs) and "static" (e.g., SRAMs) devices. For a DRAM device, data is stored in a capacitor, where an access transistor gated by a wordline selectively couples the capacitor to a bit line. DRAMs are relatively simple, and typically occupy less data, because the charge stored in the cell capacitors tends to dissipate. Accordingly DRAMs need to be refreshed periodically in order to preserve the content of the memory. SRAM devices, on the other hand, do not need to be refreshed. SRAM cells typically include several transistors configured as a flip-flop having two stable states, representative of two binary data states. Since the SRAM cells include several transistors, however, SRAM cells occupy more area than do DRAM cells. However, SRAM cells operate relatively quickly and do not require refreshing and the associated logic circuitry for refresh operations.

A major disadvantage of SRAM and DRAM devices is volatility, wherein removing power from such devices causes the data stored therein to be lost. For instance, the charge stored in DRAM cell capacitors dissipates after power has been removed, and the voltage used to preserve the flip-flop data states in SRAM cells drops to zero, by which the flip-flop loses its data. Accordingly, SRAMs and DRAMs are commonly referred to as "volatile" memory devices. Non-volatile memories are available, such as Flash and EEPROM. However, these types of non-volatile memory have operational limitations on the number of write cycles. For instance, Flash memory devices generally have life spans from 100K to 10MEG write operations.

Recently, non-volatile ferroelectric RAM devices have been developed, which are commonly referred to as FERAMs or FRAMs. FERAM cells employ ferroelectric cell capacitors including a pair of capacitor plates with a ferroelectric material between them. Ferroelectric materials have two different stable polarization states that may be used to store binary information, where the ferroelectric behavior follows a hysteresis curve of polarization versus applied voltage. FERAMs are non-volatile memory devices, because the polarization state of a ferroelectric cell capacitor remains when power is removed from the device. Ferroelectric memories provide certain performance advantages over other forms of non-volatile data storage devices, such as Flash and EEPROM type memories. For example, ferroelectric memories offer short programming (e.g., write access) times and low power consumption. However, access times in SRAM and DRAM type memories are significantly shorter than in FERAM devices.

Hybrid memory devices have been developed, which include volatile and non-volatile portions. For example, memories have been constructed combining SRAM cells with ferroelectric devices, wherein the memory may be operated as an SRAM, with the capability to backup or save the volatile single SRAM data bit to a ferroelectric capacitor associated with the SRAM cell. The non-volatile data may thereafter be retrieved from the ferroelectric capacitor and transferred to the SRAM cell. In the interim, the SRAM cell may be operated as normal SRAM, even while non-volatile data resides in the ferroelectric capacitor. However, conventional hybrid memory devices store only a single non-volatile bit per cell. Thus, there is a need for improved hybrid memory devices and methods by which more than one non-volatile data state may be stored.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One aspect of the invention provides memory cells comprising a volatile portion adapted to store a binary volatile data state, and a non-volatile portion coupled with the volatile portion, where the non-volatile portion is adapted to store multiple non-volatile data states. In one implementation, the non-volatile portion comprises a plurality of first ferroelectric capacitors coupled with a first internal node of the volatile portion, and a plurality of second ferroelectric capacitors coupled with a second internal node of the volatile portion.

In another aspect of the invention, the memory cell further comprises a control circuit for providing plateline signals to the non-volatile portion. In one example, the non-volatile portion comprises a plurality of ferroelectric capacitor pairs individually comprising one of the first ferroelectric capacitors and one of the second ferroelectric capacitors, in which the individual pairs provide storage of a binary non-volatile data state and where the plateline signals are individually coupled with the ferroelectric capacitor pairs. In one implementation, the control circuit selectively provides a boosted plateline signal greater than a supply voltage to a targeted ferroelectric capacitor being read, and provides zero volt plateline signals to non-targeted ferroelectric capacitors during the non-volatile read.

According to yet another aspect of the invention, the control circuit provides separate plateline signals to the first and second sets of ferroelectric capacitors, and the ferroelectric capacitors are individually operable to store a binary non-volatile data state. In this example, the control circuit selectively provides a plateline signal to one of the first ferroelectric capacitors to be read and provides plateline signals of a first voltage to some of the second ferroelectric capacitors and provides plateline signals of a second different voltage to the remaining second ferroelectric capacitors during a non-volatile data read operation. This provides a reference voltage at the second internal node during a non-volatile read operation to read a non-volatile data state from the targeted one of the first ferroelectric capacitors. Where one of the second ferroelectric capacitors is to be read, the control circuit provides one of the second plateline signals corresponding to the targeted second ferroelectric capacitor, and provides plateline signals of one voltage to some but not all of the first ferroelectric capacitors and provides plateline signals of a different voltage to the other first ferroelectric capacitors. This creates a reference voltage at the first internal node during the non-volatile read operation to read a non-volatile data state from the targeted one of the plurality of second ferroelectric capacitors.

According to another aspect of the invention, a method is provided for reading a non-volatile data state from a non-volatile portion of a memory cell into a volatile portion of the memory cell in a semiconductor device. The method comprises providing a boosted plateline signal greater than a supply voltage to a targeted ferroelectric capacitor in the non-volatile portion to read a non-volatile data state from the targeted ferroelectric capacitor. This extracts more signal charge from the targeted ferroelectric capacitor or capacitor pair. In one example, the method further comprises providing zero volt plateline signals to one or more non-targeted ferroelectric capacitors in the non-volatile portion while providing the boosted plateline signal to the targeted ferroelectric capacitor or capacitor pair.

Yet another aspect of the invention provides a method of reading a non-volatile data state from a non-volatile portion in a hybrid memory having a plurality of first ferroelectric capacitors coupled with a first internal node in the volatile portion and a plurality of second ferroelectric capacitors coupled with a second internal node in the volatile portion. This method involves providing a plateline signal to a targeted one of the plurality of first ferroelectric capacitors during a non-volatile read operation to read a non-volatile data state from the targeted first ferroelectric capacitor. In addition, a reference voltage is provided to the second internal node of the volatile portion by selectively providing a first reference plateline signal to at least one of the second ferroelectric capacitors and providing a second different reference plateline signal to remaining second ferroelectric capacitors during the non-volatile read operation.

In one example, a supply voltage is provided to the targeted ferroelectric capacitor, and two different plateline signals are provided to subsets of the second ferroelectric capacitors to create a capacitive voltage divider. The second internal node of the volatile portion is thereby provided with a reference voltage through control of the second plateline signals. In one implementation, the provision of the reference voltage to the second internal node comprises precharging plateline terminals of all of the first and second ferroelectric capacitors to zero volts and applying an intermediate voltage between 0V and a supply voltage to non-targeted first ferroelectric capacitors and the remaining second ferroelectric capacitors. The intermediate voltage is then applied to the at least one of the second ferroelectric capacitors while applying the supply voltage to the targeted one of the plurality of first ferroelectric capacitors.

Still another aspect of the invention provides methods for reading a non-volatile data state from a memory cell, where the cell comprises a non-volatile portion having first and second ferroelectric capacitors coupled with a first internal node of a volatile portion and third and fourth ferroelectric capacitors coupled with a second internal node of the volatile portion. The method comprises providing a boosted plateline signal greater than a supply voltage, such as about twice the supply voltage or more, to the first and third ferroelectric capacitors, and providing a second plateline signal less than the supply voltage to the second and fourth ferroelectric capacitors. The method may be advantageously employed to read non-volatile data without having to precharge or equalize the cell.

In accordance with yet another aspect of the invention, a method is provided for reading a non-volatile data state in a memory cell having a non-volatile portion comprising a first ferroelectric capacitor coupled with a first internal node of the volatile portion and a second ferroelectric capacitor coupled with a second internal node of the volatile portion. This method comprises providing a boosted plateline signal greater than a supply voltage to the first and second ferroelectric capacitors, which may facilitate shortening or elimination of precharging or equalizing steps prior to the non-volatile data read operation. In one implementation of the method, providing the boosted plateline signal comprises providing a plateline signal about twice the supply voltage or more to the first and second ferroelectric capacitors.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
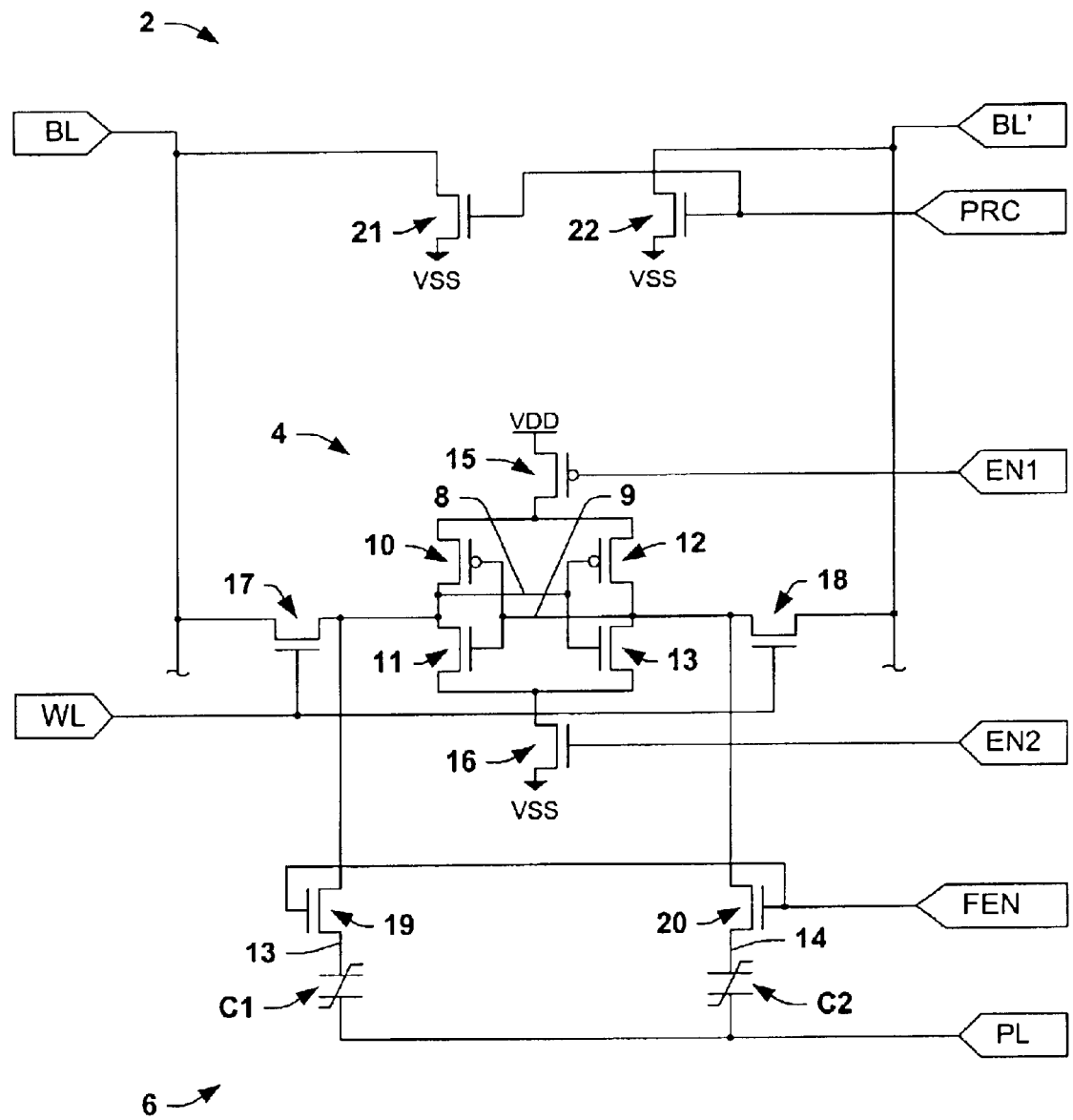
FIG. 1 is a schematic diagram illustrating a conventional hybrid memory device having a volatile SRAM cell and ferroelectric capacitor elements for storing a single non-volatile data bit.

The present invention will now be described with reference to the attached drawings, wherein like reference numerals are used to refer to like elements throughout. The invention relates to a memory apparatus comprising a volatile portion and a non-volatile portion, in which two ferroelectric capacitors are coupled to an internal node of the volatile portion. In order to better appreciate one or more features of the invention, a conventional hybrid memory device is hereinafter illustrated and described with respect to FIG. 1.

FIG. 1 illustrates a conventional hybrid memory cell 2 consisting of a CMOS SRAM cell 4 and a non-volatile (e.g., shadow) portion 6 for storing a single data bit. The SRAM cell 4 includes two PMOS transistors 10 and 12 and two NMOS transistors 11 and 13 forming a pair of cross-coupled inverters, enabled by transistors 15 and 16 according to enable signals EN1 and EN2, respectively. Internal SRAM nodes 8 and 9 are cross-coupled to the inverters, and transistors 17 and 18 are provided to couple the nodes 8 and 9 to complementary bitlines BL and BL', respectively, according to a wordline control signal WL. The nodes 8 and 9 are further coupled through a pair of NMOS transistors 19 and 20 with the upper terminals of ferroelectric capacitors C1 and C2 at nodes 13 and 14, respectively, for non-volatile data storage of a single data bit in the portion 6, wherein the transistors 19 and 20 are gated by a ferroelectric enable signal FEN.

The lower terminals of the ferroelectric capacitors C1 and C2 are coupled to a single plateline signal PL. In addition, two transistors 21 and 22 are provided for selectively precharging the bitlines BL and BL', respectively, to ground (VSS) according to a control signal PRC. In normal (e.g., volatile SRAM) operation of the cell 2, the enable signals EN1 and EN2 are active, whereby the transistor 15 pulls the upper source/drain terminals of transistors 10 and 12 to VDD and the transistor 16 grounds the lower source/drain terminals of SRAM transistors 11 and 13 to VSS. The plateline signal PL and the enable signal FEN are low, whereby the volatile and non-volatile portions 4 and 6 are decoupled from one another. The isolated volatile portion 4 thus operates as a conventional SRAM cell, which is externally accessed via the bitlines BL, BL' and the wordline WL to read and write data into the flip-flop formed by the transistors 11, 13, 10 and 12.

In an FERAM write, data may be written to the non-volatile portion 6 from the SRAM portion 4. For example, where the data in the SRAM portion 4 is such that node 8 is at a low voltage level (VSS) and the node 9 is at a high voltage level (VDD), the SRAM data may be stored in the ferroelectric capacitors C1 and C2 as follows. The signal FEN initially is brought high to allow the ferroelectric capacitors C1 and C2 to charge up with EN1 and EN2 enabled, and the plateline signal PL is initially low. The voltage at a non-volatile portion node 14 rises when the transistor 20 turns on, and the ferroelectric capacitor C2 is programmed to a first or "high" polarization state. The plateline signal PL is then brought high to charge the C1 by bringing the non-volatile portion node 13 low when the transistor 19 turns on. In this manner, the reversed voltage potential across the ferroelectric capacitor C1 causes it to be polarized to an opposite second or "low" polarization state.

In this manner, the high node 9 of the SRAM cell portion 4 corresponds to C2 being programmed to the "high" polarization state, and the low level at the node 8 of the static cell 4 has been written as a "low" polarization state to C1. Similar operation is found where the data in the SRAM is of an opposite binary value, such as where node 9 is at a low voltage level (VSS) and node 8 is at a high voltage level (VDD). Once the SRAM data has been stored in the non-volatile portion 6, the memory may thereafter be powered down without any data loss because the polarization states of capacitors C1 and C2 are maintained, thereby preserving the data. However, the SRAM portion 4 may optionally be operated as a volatile memory thereafter, without disturbing the non-volatile data in the portion 6, such as by pulling the plateline signal PL and the signal FEN low, to isolate or decouple the portions 4 and 6 from one another.

To read the non-volatile data into the SRAM 4, the signal PRC and the wordline WL are brought high to precharge the nodes 8 and 9 to ground through the transistors 17, 18, 21, and 22. The plateline PL is held low and the FEN signal is brought high to couple the capacitor nodes 13 and 14 to the SRAM nodes 8 and 9 at 0 V. Then, the precharging transistors 21 and 22 are turned off by bringing the PRC signal low, and the wordline WL is brought low to turn transistors 17 and 18 off. The plateline signal PL is brought high to provide voltages across the ferroelectric capacitors C1 and C2 such that the ferroelectric capacitor having a "high" polarization state will experience a polarization reversal. The SRAM cell is then enabled by activation of EN1 and EN2 to sense the data from the ferroelectric capacitors C1 and C2, and to latch the sensed data state. Ideally, the capacitance of the internal nodes 8 and 9 of the SRAM 4 cell is sufficiently high so that the voltages at nodes 8 and 9 stay low enough for at least partial reversal of polarization to occur for the ferroelectric capacitor C2 which had been written to the "high" polarization state. If so, the voltage at node 9 will be slightly higher than at node 8 during the FERAM read, where the SRAM 4 operates as a sense amp to sense and latch the voltage difference as volatile SRAM data.

However, the inventor has appreciated that if the SRAM capacitance is insufficient to ensure partial reversal of polarization of the ferroelectric capacitor at the "high" polarization state (e.g., C2 in this example), then the resulting voltage difference between the internal SRAM nodes 8 and 9 during sensing is small, possibly below the amount needed for proper sensing by the SRAM 4. In the device 2, the load capacitance is largely determined by the MOS transistors 10, 12, 11, and 13 of the SRAM portion 4. A capacitive imbalance condition can reduce the sense margin of the device 2 and may lead to incorrect reading of the non-volatile data (data flip), particularly where there are sensitivity imbalances in the transistors of the SRAM portion 4. For example, the transistors 11 and 13 may have different performance characteristics due to pattern size variation or due to impurity variations in the MOS channels thereof, requiring more signal charge to overcome the imbalance. If large performance characteristic imbalances exist between the transistors 11 and 13, for example, more signal charge extraction is desirable to ensure correct sensing.

The device 2 in FIG. 1 may also suffer from quick self-latching when the initial equalization is not complete and/or where the ferroelectric capacitors C1 and C2 are not closely matched. For example, small differences in the capacitors C1 and C2 may upset the sensing operation during FERAM read operations prior to signal charge extraction if insufficient voltage is applied to extract the signal charge. In addition, the equalization prior to FERAM read operations takes time and increases the access time to obtain the non-volatile data from the ferroelectric capacitors. Furthermore, the cell of FIG. 1 can store only one bit of data in the ferroelectric capacitors C1 and C2.

The present invention provides multi-bit hybrid memory cells combining volatile portions, such as single-bit SRAM circuitry, with the capability of storing multiple non-volatile data bits, such as in multiple ferroelectric capacitors coupled with the SRAM portion. Other aspects of the invention provide methods for reading non-volatile data in such multiple bit hybrid memory cells. In addition, methods are provided which allow minimization or elimination of equalization prior to non-volatile data read operations, by which access times can be improved in hybrid memory devices.

Figure 2A:
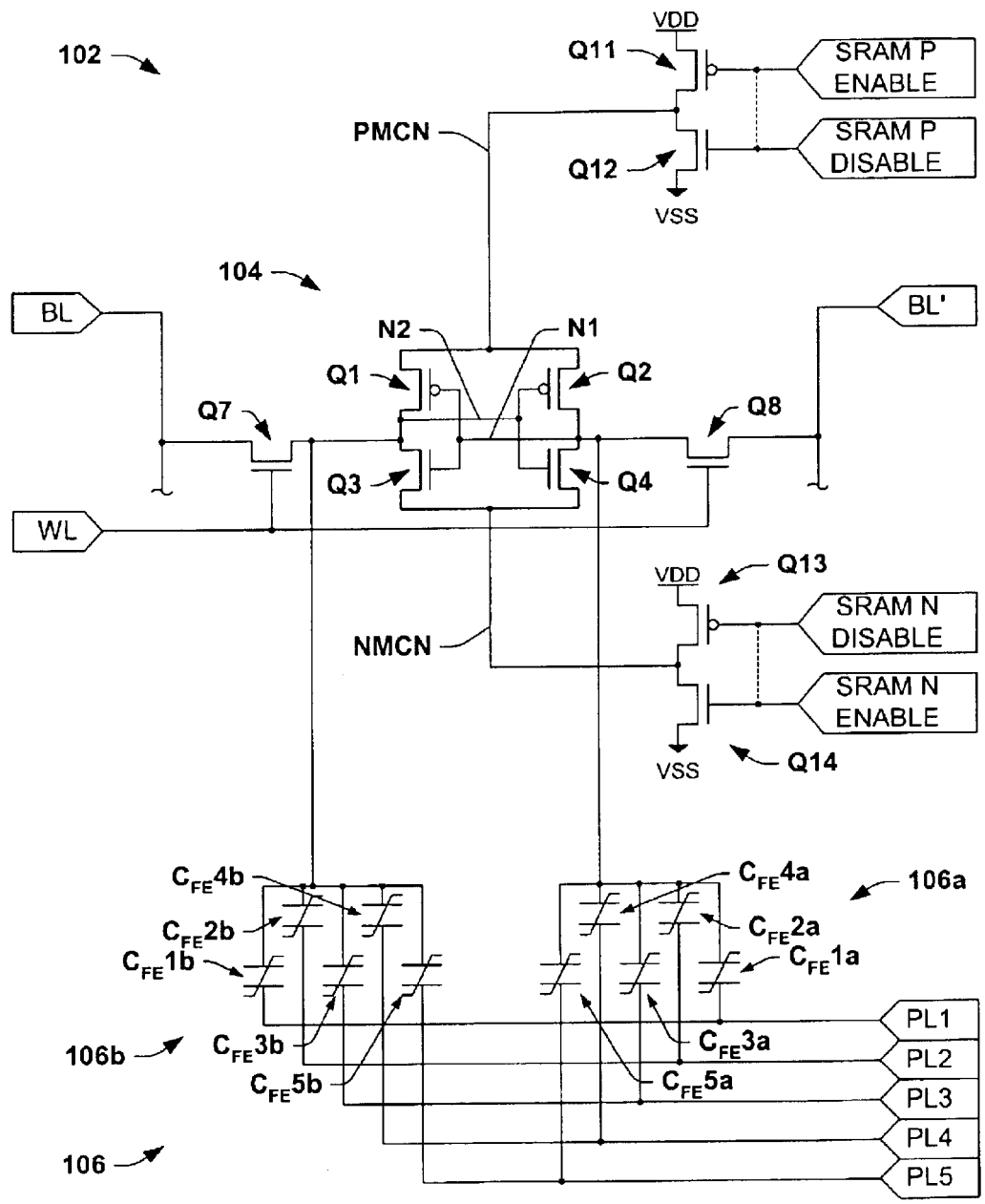
FIGS. 2A and 2B provide a schematic illustration of an exemplary memory cell in accordance with one or more aspects of the present invention.
Figure 2B:
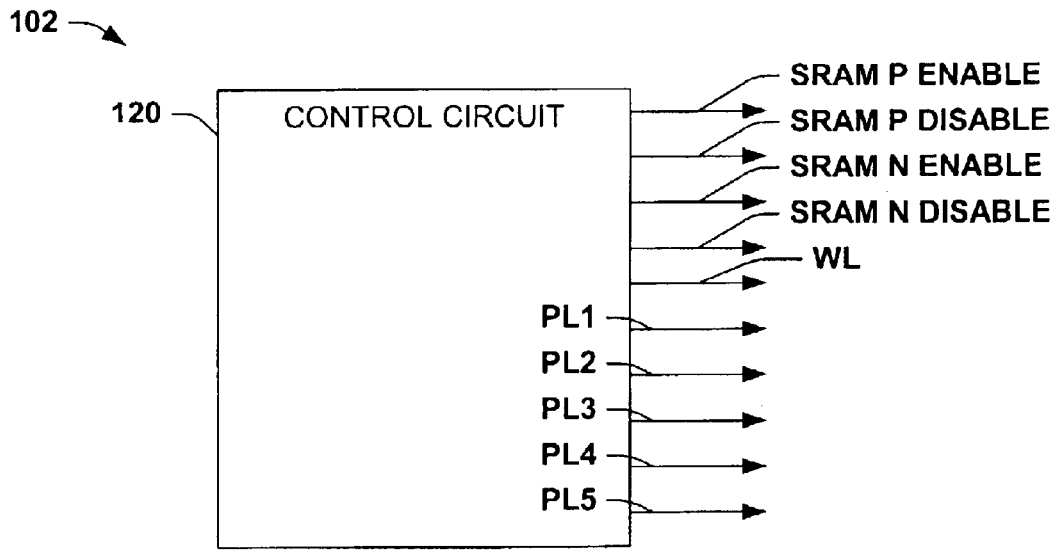
Figure 3:
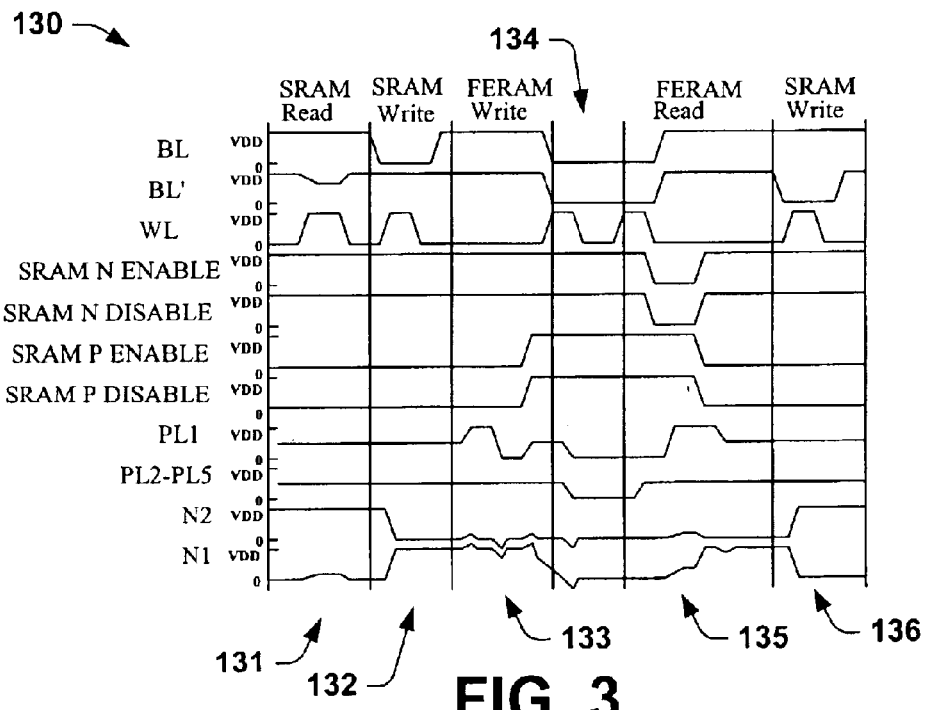
FIG. 3 is a timing diagram illustrating exemplary operation of the memory cell of FIGS. 2A and 2B.

Referring to FIGS. 2A, 2B, and 3, one aspect of the present invention allows storage of multiple non-volatile data states or bits per memory cell. An exemplary memory cell 102 is illustrated in FIGS. 2A and 2B comprising volatile and non-volatile portions 104 and 106, respectively, and a control circuit 120 (FIG. 2B), where FIG. 3 provides a timing diagram 130 illustrating exemplary operation of the memory cell 102. The exemplary volatile portion 104 is adapted to store a single binary volatile data state or bit, and includes an SRAM device comprising a flip-flop formed by two PMOS transistors Q1 and Q2 and two NMOS transistors Q3 and Q4 with internal nodes N1 and N2. However, other types of volatile memory portions may be employed in a hybrid memory device within the scope of the invention.

The nodes N1 and N2 are cross-coupled to the gates of the inverter transistors, with N1 coupled with the gates of Q1 and Q3, and N2 coupled with the gates of Q2 and Q4. External access is provided between the internal nodes N1 and N2 and bitlines BL and BL' via access transistors Q7 and Q8 according to a wordline control signal WL from the control circuit 120. The volatile SRAM portion 104 also includes a first switching circuit comprising transistors Q1 and Q12 adapted to selectively couple a first SRAM supply node PMCN with one of a supply voltage (VDD) and a ground (VSS) according to control signals SRAM P ENABLE and SRAM P DISABLE from the control circuit 120. Transistors Q13 and Q14 form a second switching circuit for selectively coupling a second SRAM supply node NMCN with either VDD or VSS according to signals SRAM P ENABLE and SRAM P DISABLE from the control circuit 120. In one possible implementation, the signals SRAM P ENABLE and SRAM P DISABLE may be the same signal, and the signals SRAM N ENABLE and SRAM N DISABLE may likewise be a single signal.

The control circuit 120 provides other timing and control signals in the device 102, including the wordline WL, plateline signals PL1–PL5, and others, and may be fabricated using any appropriate circuitry for implementing operation of the cell 102 in accordance with the functionality illustrated and described herein. In one exemplary implementation, the control circuit 120 provides timing and control signals for operation of the memory cell 102 generally in accordance with the timing diagram 130 of FIG. 3.

The non-volatile portion 106 is coupled with the internal nodes N1 and N2 of the volatile portion 104, and operates to store two or more binary non-volatile data states or bits. In the illustrated example, the non-volatile portion 106 comprises a plurality of first ferroelectric capacitors 106a, including ferroelectric capacitors $C_{FE}1a$, $C_{FE}2a$, $C_{FE}3a$, $C_{FE}4a$, and $C_{FE}5a$, each having a first terminal coupled with the first internal node N1, and second terminals individually coupled with plateline signals PL1–PL5, respectively, from the control circuit 120. In addition, the non-volatile portion 106 comprises a plurality of second ferroelectric capacitors 106b, including ferroelectric capacitors $C_{FE}1b$, $C_{FE}2b$, $C_{FE}3b$, $C_{FE}4b$, and $C_{FE}5b$, coupled with the second internal node N2 and with the plateline signals PL1–PL5, respectively.

The ferroelectric capacitors $C_{FE}$ in the non-volatile portion 106 are thus configured to form a plurality of ferroelectric capacitor pairs $C_{FE}1a/C_{FE}1b$, $C_{FE}2a/C_{FE}2b$, $C_{FE}3a/C_{FE}3b$, $C_{FE}4a/C_{FE}4b$, and $C_{FE}5a/C_{FE}5b$, which are coupled with the plateline signals PL1, PL2, PL3, PL4, and PL5, respectively. These ferroelectric capacitor pairs are individually operable to store a binary non-volatile data state or bit. In this manner, the plurality of first ferroelectric capacitors 106a are individually coupled between the first internal node N1 and individual ones of the plateline signals PL1–PL5, and the plurality of second ferroelectric capacitors 106b are individually coupled between the second internal node N2 and individual ones of the plateline signals PL1–PL5. In this arrangement, the control circuit 120 may be operated to selectively provide the plateline signals to the non-volatile portion according to a particular one of five possible non-volatile data states being accessed during a non-volatile read or write operation.

It is noted that while the exemplary memory cell 102 is illustrated having 10 ferroelectric capacitors $C_{FE}$ associated with a single bit volatile memory portion 104, any integer number of two or more ferroelectric capacitors may be provided in the first and second pluralities 106a and 106b in accordance with the present invention. Moreover, the ferroelectric capacitors $C_{FE}$ in the memory cell 102 and other memory cells according to the invention may be fabricated using any appropriate ferroelectric materials, examples of which include Pb(Zr,Ti)O3(PZT), (Ba,Sr)TiO3 (BST), SrTiO3 (STO) and SrBi2Ta2O9 (SBT), BaTiO3 (BTO), (Bi1-xLax) 4Ti3O12 (BLT), or other ferroelectric material formed between two conductive electrodes in a semiconductor wafer.

In one implementation, the cell 102 may be operated by the control circuit 120 in accordance with the exemplary timing diagram 130 of FIG. 3. The SRAM Read and SRAM Write operations (segments 131, 132, and 136 in the timing diagram 130) are generally in accordance with SRAM memory cell practices as are known. In these operations, the volatile portion 104 is accessed via the bitlines BL, BL' according to the wordline signal WL from the control circuit 120 to read and write data into the flip-flop or latch formed by the transistors Q1–Q4. In the illustrated sequence of operations in FIG. 3, the volatile SRAM portion 104 initially stores a volatile data state in which N2 is high (VDD) and N1 is low (VSS), which is read at 131 in the timing diagram 130 to the bitlines BL/BL' via the access transistors Q7 and Q8. Thereafter, an opposite volatile data state is written to the SRAM portion 104 at 132, wherein N1 is high and N2 is low.

To write the volatile data state from the SRAM portion 104 to the non-volatile portion 106 (e.g., FERAM Write operation at 133 in the timing diagram 130), the control circuit 120 selects one of the non-volatile ferroelectric capacitor pairs $C_{FE}1a/C_{FE}1b$, $C_{FE}2a/C_{FE}2b$, $C_{FE}3a/C_{FE}3b$, $C_{FE}4a/C_{FE}4b$, or $C_{FE}5a/C_{FE}5b$ to receive the data. In the illustrated example, the non-volatile data state is stored or written from the SRAM 104 to the first ferroelectric capacitor pair $C_{FE}1a/C_{FE}1b$ via the plateline signal PL1. However, alternative operation of the various plateline signals PL2–PL5 may be employed in order to read or write non-volatile data in the other four non-volatile ferroelectric capacitor pairs in accordance with the present invention.

In the FERAM Write example at 133 in FIG. 3, the SRAM internal nodes N1 and N2 are VDD and 0V, respectively. The non-targeted plateline signals PL2–PL5 are held at VDD/2 (e.g., less than the coercive voltage) to prevent the non-targeted ferroelectric capacitor pairs $C_{FE}2a/C_{FE}2b$, $C_{FE}3a/C_{FE}3b$, $C_{FE}4a/C_{FE}4b$, and $C_{FE}5a/C_{FE}5b$ from being polarized. Plateline PL1 is initially at VDD/2, and is then pulsed up to VDD, providing a coercive voltage of one polarity to the ferroelectric capacitor $C_{FE}1b$, and thereafter brought down to 0V to provide a coercive voltage of an opposite polarity to the other ferroelectric capacitor $C_{FE}1a$ in the pair. The plateline PL1 is then brought back to VDD/2 to complete the FERAM Write operation at 133.

In this manner, the ferroelectric capacitors $C_{FE}1a$ and $C_{FE}1b$ acquire opposite polarization states, which together indicate a first binary non-volatile data state or bit corresponding to the volatile data in the SRAM portion 104. It will be appreciated that where the SRAM volatile data is such that N1 is low (0V) and N2 is high (VDD), that a complementary non-volatile data state would be written to the ferroelectric capacitor pair $C_{FE}1a/C_{FE}1b$, wherein bringing the plateline PL1 up to VDD polarizes $C_{FE}1a$ and bringing PL1 down to 0V then polarizes $C_{FE}1b$. Although not illustrated in the exemplary timing diagram 130, similar operation of one of the other plateline signals PL2, PL3, PL4, or PL5 may be employed by the control circuit 120 to store a non-volatile data state from the SRAM portion 104 to a corresponding one of the other ferroelectric capacitor pairs $C_{FE}2a/C_{FE}2b$, $C_{FE}3a/C_{FE}3b$, $C_{FE}4a/C_{FE}4b$, or $C_{FE}5a/C_{FE}5b$ in the non-volatile portion 106.

Continuing in the timing diagram 130, an exemplary FERAM Read operation is performed at 135, targeting the capacitor pair $C_{FE}1a/C_{FE}1b$. The cell 102 is initially equalized at 134, wherein the wordline WL is brought high then low by the control circuit 120 while the bitlines BL and BL' are held at 0V (e.g., using precharge circuitry, not shown) to equalize or precharge the SRAM internal nodes N1 and N2 to 0V. During this precharge period 134, the control circuit 120 sets the platelines PL1–PL5 to 0V and brings the signals SRAM N ENABLE, SRAM N DISABLE, SRAM P ENABLE and SRAM P DISABLE to VDD to help bias the bitlines BL and BL' low. At 135, the signals SRAM N ENABLE and SRAM N DISABLE are brought low to 0V. BL and BL' are biased to VDD to prevent disturbance to the sensing by leakage through the wordline access transistors Q7 and Q8.

Any of the non-volatile data states may be read using appropriate plateline signals from the control circuit 120 in accordance with the present invention. In the illustrated example at 135, the non-volatile data state of the targeted ferroelectric capacitor pair $C_{FE}1a/C_{FE}1b$ is read, wherein the target plateline PL1 remains at 0V and PL2–PL5 are biased to VDD/2 and SRAM N ENABLE and SRAM N DISABLE are brought low. This biasing helps to apply enough voltage to the target ferroelectric capacitors $C_{FE}1a$ and $C_{FE}1b$, while avoiding disturbance to the other ferroelectric capacitors $C_{FE}2a/C_{FE}2b$, $C_{FE}3a/C_{FE}3b$, $C_{FE}4a/C_{FE}4b$, and $C_{FE}5a/C_{FE}5b$ during sensing by the SRAM portion 104, for example, where the coercive voltage is greater than VDD/2.

Sensing begins with application of a positive pulse (up to VDD) to the plateline PL1. During sensing, the other ferroelectric capacitors $C_{FE}2a/C_{FE}2b$, $C_{FE}3a/C_{FE}3b$, $C_{FE}4a/C_{FE}4b$, and $C_{FE}5a/C_{FE}5b$ operate as load capacitance to extract signal charge from $C_{FE}1a/C_{FE}1b$ through charge sharing, wherein the SRAM portion 102 operates as a sense amp to sense the voltage difference between N1 and N2 created by the switching charge from the ferroelectric capacitors $C_{FE}1a$ and $C_{FE}1b$. As a result of the sensing operation of the SRAM portion 104 in this example, the SRAM internal nodes N1 and N2 are brought high and low, respectively as shown at the end of segment 135 in FIG. 3.

In this manner, the non-volatile data state from the ferroelectric capacitor pair $C_{FE}1a/C_{FE}1b$ is read from the non-volatile portion 106 into the volatile SRAM portion 104, which may then be externally accessed through SRAM Read operations (e.g., 131 in the timing diagram 130) using the bitlines BL/BL' and the access transistors Q7 and Q8. It is noted that the FERAM Read operation at 135 is destructive. Therefore, if the non-volatile data state or bit needs to be retained, an FERAM Write operation (not shown in the timing diagram 130) may be performed after the FERAM READ at 135, generally similar to that illustrated at 133. Thereafter, the volatile data state in the SRAM portion 104 may be overwritten, as illustrated in a subsequent SRAM Write operation at 136 in the exemplary timing diagram 130 of FIG. 3. Thus, it is seen that the exemplary memory cell 102 provides for multi-bit non-volatile data storage and retrieval through appropriate operation of the control circuit 120.

Figure 2C:
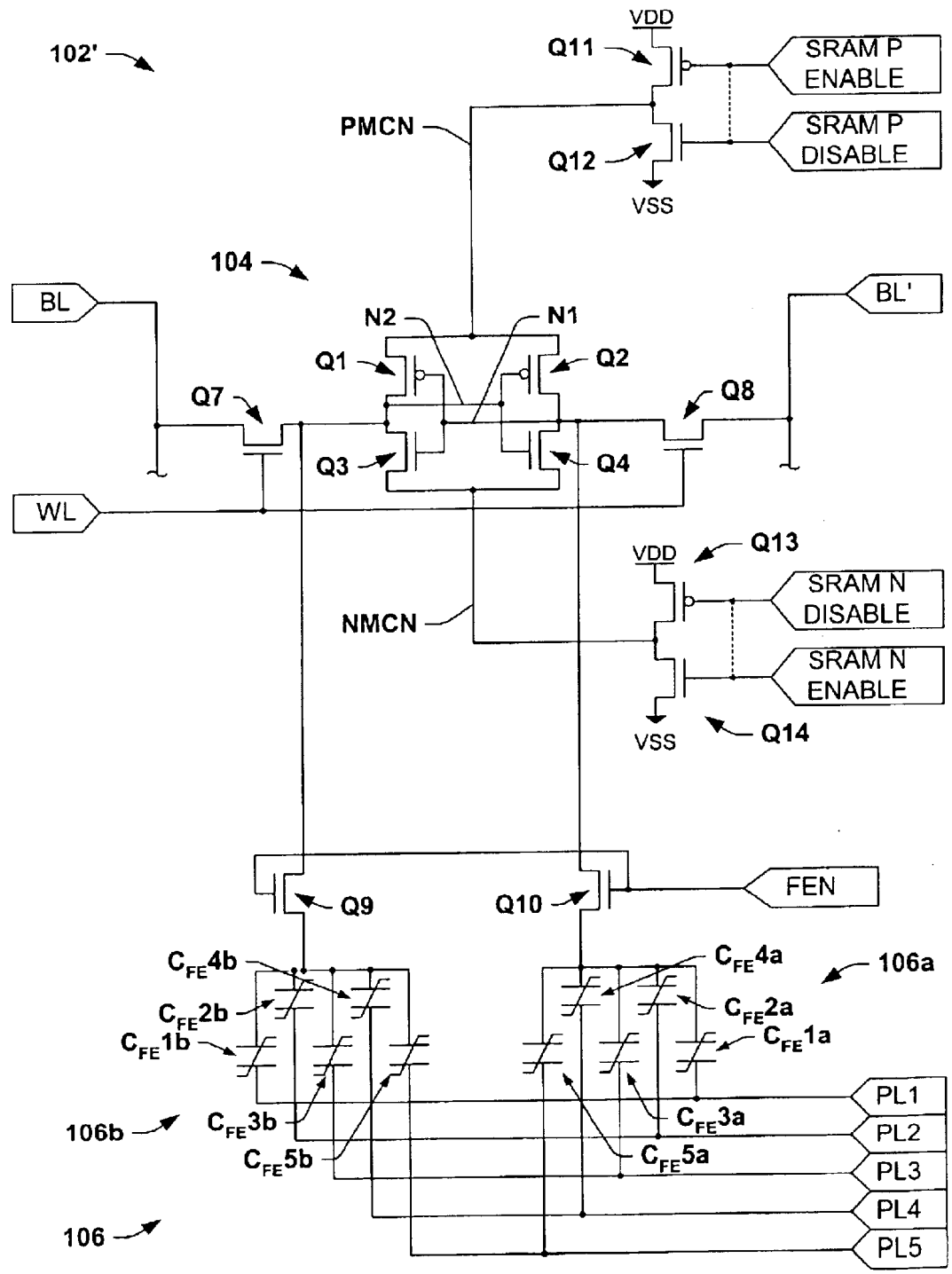
FIG. 2C is a schematic diagram illustrating another exemplary memory cell having NMOS transistors to selectively isolate the volatile and non-volatile portions from one another.

FIG. 2C illustrates another exemplary memory cell 102', wherein the non-volatile portion 106 comprises NMOS transistors Q9 and Q10 to selectively couple or isolate the volatile and non-volatile portions from one another according to a ferroelectric enable control signal FEN (e.g., from the control circuit 120 of FIG. 2B). During SRAM Read and SRAM Write operations (e.g., 131 and 132 in FIG. 3 above), the enable signal FEN is held low, whereby the volatile and non-volatile portions 104 and 106 are decoupled from one another. The isolated volatile portion 104 thus operates as a conventional SRAM cell, which is externally accessed via the bitlines BL, BL' and the wordline WL to read and write data into the flip-flop formed by the transistors Q1–Q4. During FERAM Read and FERAM Write operations (e.g., at 135 and 133 in FIG. 3), the FEN signal is held high to couple the volatile and non-volatile portions 104 and 106.

Figure 4A:
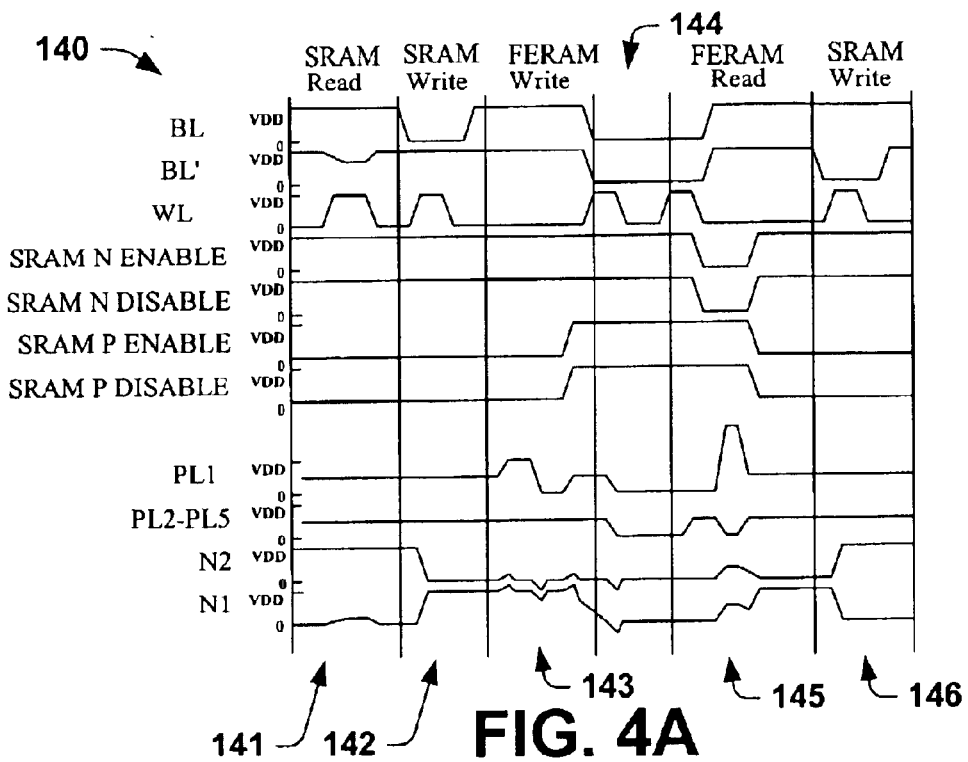
FIG. 4A is a timing diagram illustrating another exemplary operation of the memory cell of FIGS. 2A and 2B in accordance with another aspect of the invention.
Figure 4B:
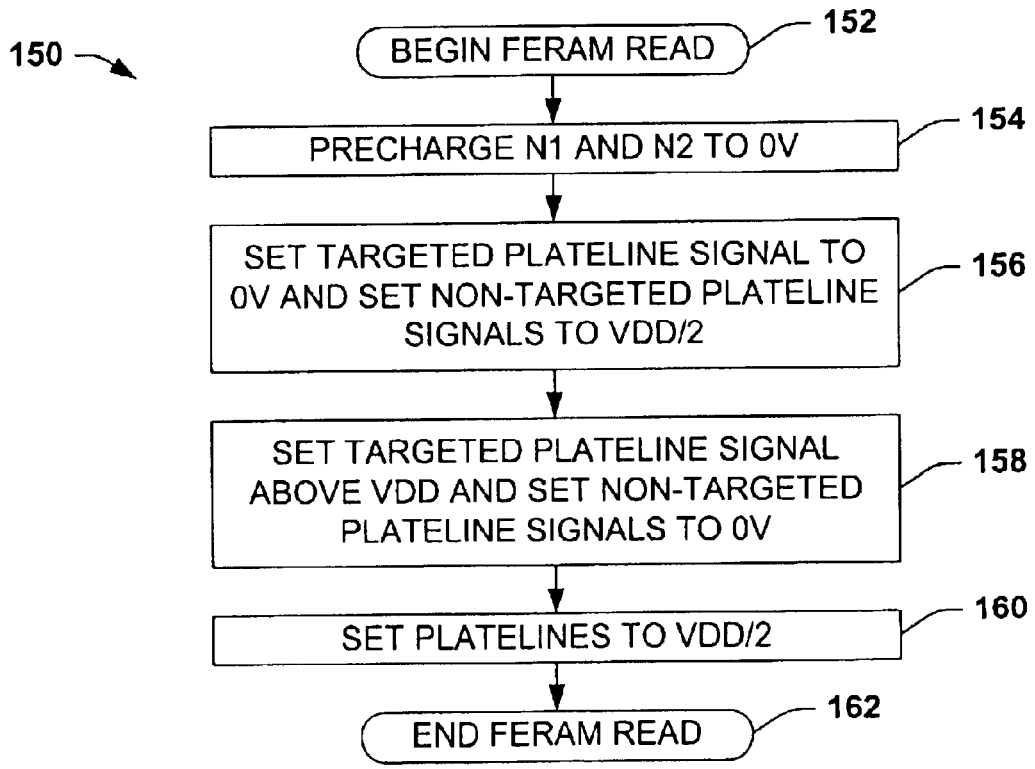
FIG. 4B is a flow diagram illustrating an exemplary method of reading a non-volatile data state from a non-volatile portion of a memory cell into a volatile portion of the memory cell in accordance with the invention.

Referring also to FIGS. 4A and 4B, another aspect of the invention involves alternate control of the target plateline (e.g., PL1 in the illustrated example) during FERAM Read operations as illustrated in a timing diagram 140 of FIG. 4A, which may be implemented, for example, in the cell 102 by appropriate design or operation of the exemplary control circuit 120. The timing and control in this example for SRAM Read and Write operations (e.g., at 141, 142, and 146) are similar to those illustrated at 131, 132, and 136 in FIG. 3, and also the FERAM Write operation at 143 and the equalization at 144 are similar to those described above (e.g., at 133 and 134 in FIG. 3).

As illustrated at 145 in FIG. 4A, however, the control circuit 120 selectively provides a boosted plateline signal PL1 to the targeted ferroelectric capacitors $C_{FE}1a$ and $C_{FE}1b$ during the non-volatile read operation, where the boosted plateline signal PL1 is greater than the supply voltage VDD. This facilitates the extraction of more signal charge from the targeted ferroelectric capacitor pair by applying an over-drive pulse voltage. This enhanced signal charge extraction during FERAM Read operations may be further assisted by contemporaneously or concurrently applying a negative pulse of the other (e.g., non-targeted) plateline signals PL2–PL5 from VDD/2 down to 0V, so as to negatively pulse the non-targeted load capacitors $C_{FE}2a/C_{FE}2b$, $C_{FE}3a/C_{FE}3b$, $C_{FE}4a/C_{FE}4b$, and $C_{FE}5a/C_{FE}5b$. By this aspect of the invention, much less equalization is required compared with the case of FIG. 3. It is again noted that the FERAM Read operation at 145 is destructive, and if the non-volatile data state or bit needs to be retained, an FERAM Write operation (not shown in the timing diagram 140) may be performed after the FERAM READ at 145, generally similar to that illustrated at 143.

FIG. 4B illustrates an exemplary method 150 for reading a non-volatile data state from a non-volatile portion of a memory cell into a volatile portion of the memory cell in a semiconductor device. Although the exemplary method 150 and other methods are illustrated and described herein as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated acts or events may be required to implement a methodology in accordance with the present invention. Moreover, it will be appreciated that the methods according to the present invention may be implemented in association with the apparatus and systems illustrated and described herein as well as in association with other systems and structures not illustrated. For instance, the exemplary method 150 may be implemented in the memory cell 102 as illustrated in FIGS. 2A, 2B, and 4A through appropriate design or operation of the exemplary control circuit 120.

Beginning at 152, the method 150 comprises precharging the internal nodes of the volatile portion (e.g., nodes N1 ands N2 of the SRAM portion 104 above) to 0V at 154. At 156, the targeted plateline signal (e.g., PL1 in the above examples) is set to 0V and the non-targeted plateline signals (e.g., PL2–PL5) are set to VDD/2. At 158, a boosted plateline signal (PL1) greater than a supply voltage is provided to a targeted ferroelectric capacitor in the non-volatile portion to read a non-volatile data state therefrom. Also at 158, zero volt plateline signals are provided to non-targeted ferroelectric capacitors (e.g., via PL2–PL5 above) in the non-volatile portion while providing the boosted plateline signal to the targeted ferroelectric capacitor or capacitors. Thereafter at 160, the plateline signals are returned to VDD/2 or some other intermediate voltage between 0V and the supply voltage VDD, before the method 150 ends at 162. Where the non-volatile data state is to be retained, an FERAM Write or restore operation (not shown) may optionally be performed after the method 150 or as a final step thereof, so as to restore the non-volatile data that has just been read.

Figure 5A:
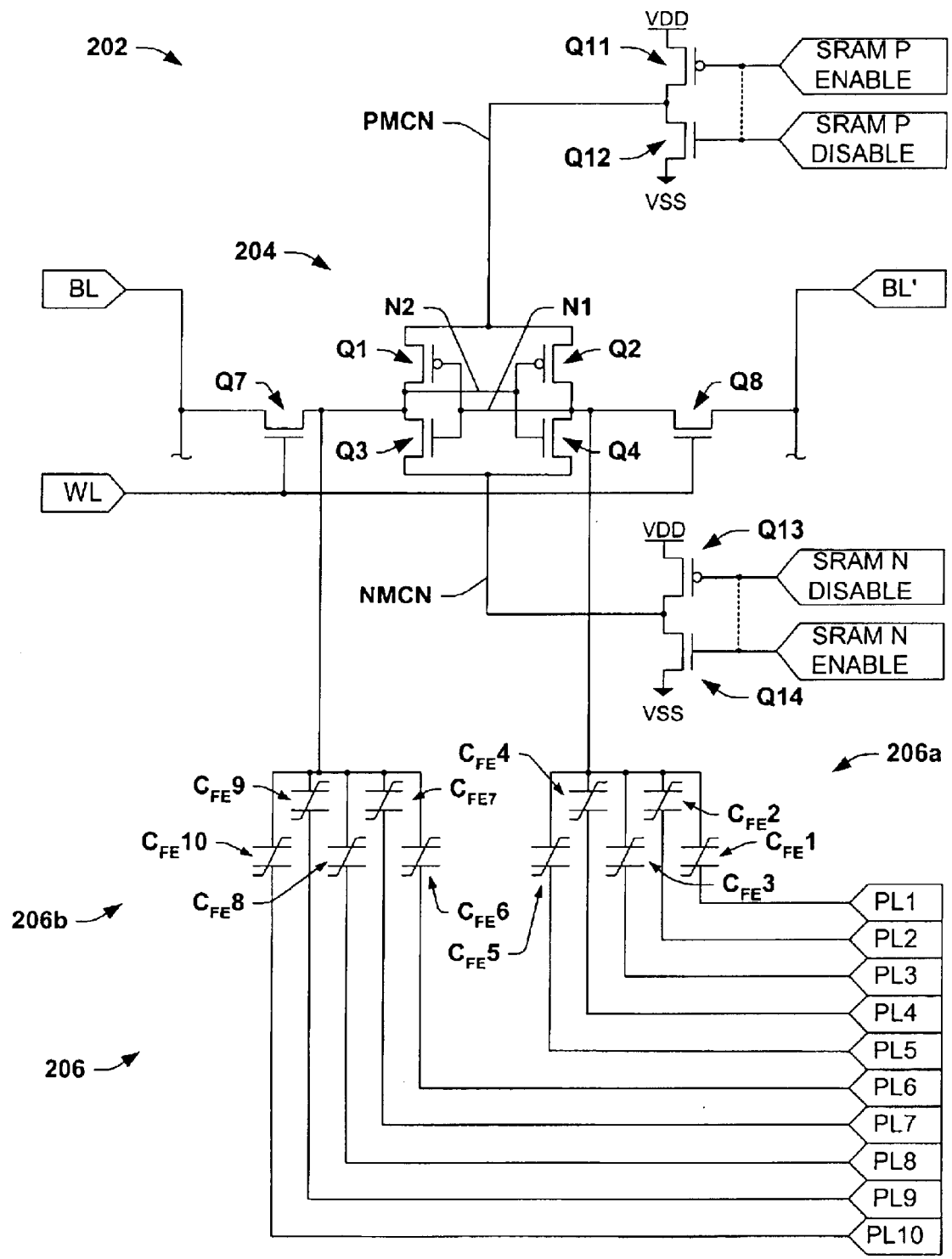
FIGS. 5A and 5B provide a schematic illustration of another exemplary memory cell in accordance with the present invention.
Figure 5B:
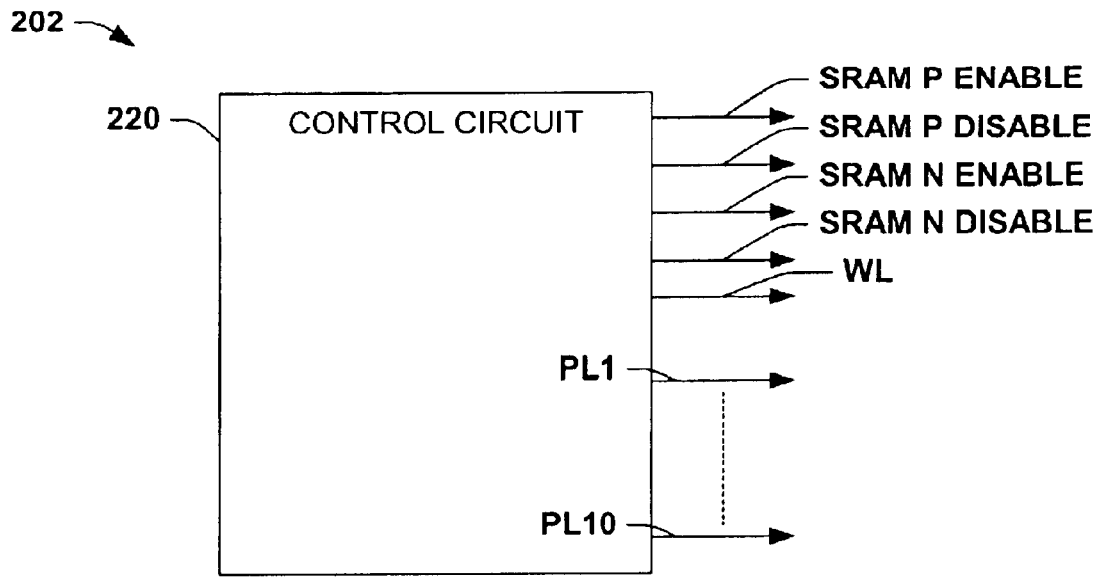
Figure 6A:
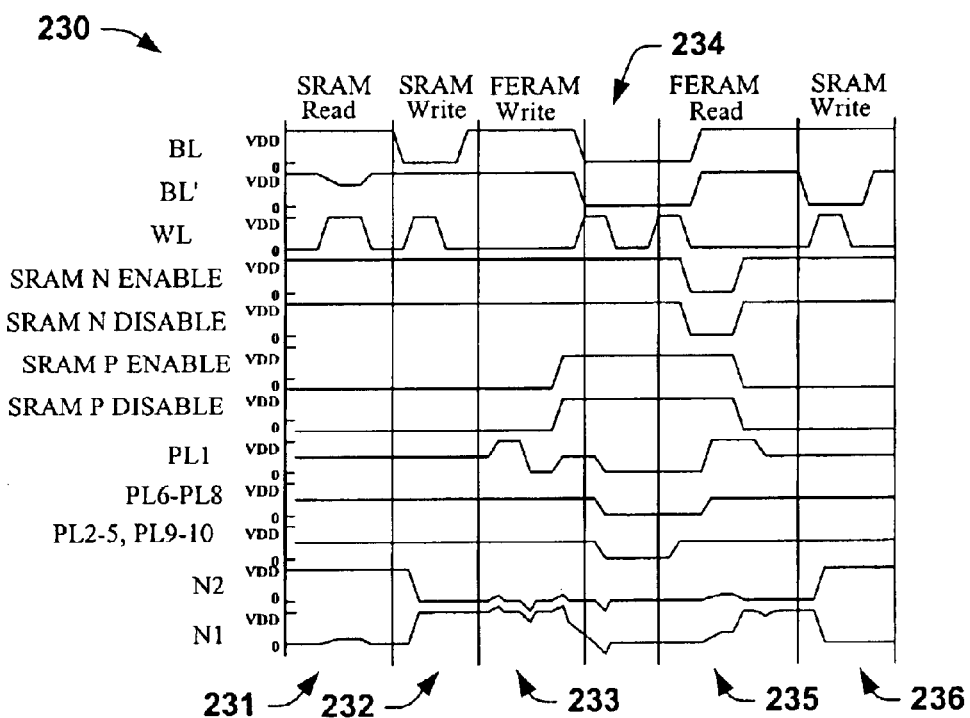
FIG. 6A provides a timing diagram illustrating an exemplary operation of the memory cell of FIGS. 5A and 5B.

Referring now to FIGS. 5A, 5B, and 6A, another aspect of the invention relates to memory cells comprising a volatile portion adapted to store a binary volatile data state, and a non-volatile portion adapted to store two or more binary non-volatile data states. In FIGS. 5A and 5B, an exemplary memory cell 202 is illustrated in accordance with this aspect of the invention, comprising a volatile portion 204 similar to the portion 104 described above in connection with FIG. 2A, as well as a non-volatile portion 206 and a control circuit 220 (FIG. 5B). The volatile portion 204 comprises first and second internal nodes N1 and N2, and the non-volatile 206 portion comprises a plurality of first ferroelectric capacitors 206a ($C_{FE}1$, $C_{FE}2$, $C_{FE}3$, $C_{FE}4$, and $C_{FE}5$) coupled with the first internal node N1, and a plurality of second ferroelectric capacitors 206b ($C_{FE}6$, $C_{FE}7$, $C_{FE}8$, $C_{FE}9$, and $C_{FE}10$) coupled with the second internal node N2.

Unlike the cell 102 of FIGS. 2A and 2B above, the control circuit 220 of the cell 202 in FIGS. 5A and 5B provides separate plateline signals to each of the ferroelectric capacitors $C_{FE}$ in the non-volatile portion 206. The control circuit 220 provides a plurality of first plateline signals PL1–PL5 to the plurality 206a of first ferroelectric capacitors $C_{FE}1$–$C_{FE}5$, respectively, and provides a plurality of second plateline signals PL6–PL10 to the plurality 206b of second ferroelectric capacitors $C_{FE}6$–$C_{FE}10$, respectively. The control circuit 220 provides other timing and control signals in the device 202, including the wordline WL, plateline signals PL1–PL10, and others, and may be fabricated using any appropriate circuitry for implementing operation of the cell 202 in accordance with the functionality illustrated and described herein. In one exemplary implementation, the control circuit 220 provides timing and control signals for operation of the memory cell 202 generally in accordance with the timing diagram 230 of FIG. 6A, described further below.

The ferroelectric capacitors $C_{FE}1$–$C_{FE}10$ are individually operable to store a binary non-volatile data state or bit, whereby ten bits of non-volatile data may be stored in the illustrated cell 202. The first ferroelectric capacitors $C_{FE}1$–$C_{FE}5$ are individually coupled between the first internal node N1 and individual ones of the first plateline signals PL1–PL5, and the second ferroelectric capacitors $C_{FE}6$–$C_{FE}10$ are individually coupled between the second internal node N2 and individual ones of the second plateline signals PL6–PL10. In this configuration, the control circuit 220 may be operated to selectively provide the plateline signals PL1–PL10 to the non-volatile portion according to a particular one of ten possible non-volatile data states being accessed during a non-volatile read or write operations. Although the exemplary memory cell 202 is illustrated having 10 ferroelectric capacitors $C_{FE}$ associated with a single bit volatile memory portion 204, any integer number of two or more ferroelectric capacitors may be provided in each of the first and second pluralities 206a and 206b in accordance with the present invention.

One possible operation of the exemplary cell 202 is illustrated in a timing diagram 230 in FIG. 6A in accordance with the invention, wherein the illustrated timing and control signals are provided by the control circuit 220. SRAM operation is similar to that described above with respect to FIGS. 2A, 2B, and 3, wherein the illustrated operations in the timing diagram 230 provide for SRAM Read and SRAM Write operations at 231, 232, and 236 in FIG. 6A. These are illustrated in the timing diagram 230 generally in accordance with known SRAM memory cell practices, wherein the volatile portion 204 is externally accessed via the bitlines BL, BL' according to the wordline signal WL from the control circuit 220 to read and write volatile data. In the illustrated sequence of operations in FIG. 6A, the volatile SRAM portion 204 initially retains a volatile data state where N2 is high and N1 is low, which is subsequently read at 231. Thereafter, an opposite volatile data state is written to the SRAM portion 204 at 232, where N1 is high and N2 is low.

At 233, this volatile data state or bit is written from the SRAM portion 204 to the non-volatile portion 206, wherein the control circuit 220 selects one of the non-volatile ferroelectric capacitors $C_{FE}1$–$C_{FE}10$ to receive the data. In the illustrated example, the non-volatile data state is stored or written from the SRAM 204 to the first ferroelectric capacitor $C_{FE}1$ via the first plateline PL1, although it will be appreciated that alternative operation of the various plateline signals PL2–PL10 allow non-volatile read or write operations targeting the other nine non-volatile ferroelectric capacitors $c_{FE}2$–$C_{FE}10$, respectively. In the exemplary FERAM Write operation at 233, the SRAM internal nodes N1 and N2 are VDD and 0V, respectively. The non-targeted first plateline signals PL2–PL5 and the second plateline signals PL6–PL10 are held at VDD/2 (e.g., less than the coercive voltage) to prevent the non-targeted ferroelectric capacitors $C_{FE}2$–$C_{FE}10$ from being polarized.

At 233, the targeted plateline PL1 is initially at VDD/2, and is then pulsed up to VDD, and thereafter brought down to 0V to provide a coercive voltage of one polarity to the targeted ferroelectric capacitor $C_{FE}1$. Alternatively, where the opposite data is initially stored in the SRAM 204 (e.g., N1 low and N2 high, not shown), pulsing the plateline PL1 up to VDD provides a coercive voltage of an opposite polarity to the targeted ferroelectric capacitor $C_{FE}1$. The plateline PL1 is then brought back to VDD/2 to complete the FERAM Write operation at 233. In this manner, the ferroelectric capacitor $C_{FE}1$ acquires a polarization state indicative of a first binary non-volatile data bit. It will be appreciated that similar operation of one of the other plateline signals PL2–PL10 may be employed by the control circuit 220 during an FERAM Write operation to store a non-volatile data state from the SRAM portion 204 to a corresponding one of the ferroelectric capacitors $C_{FE}2$–$C_{FE}10$ in the non-volatile portion 206.

To read the non-volatile data from a targeted one of the ferroelectric capacitors (e.g., $C_{FE}1$ in the example at 235 of FIG. 6A), the cell 202 is initially equalized at 234. In this operation, the wordline WL is brought high then low by the control circuit 220 while the bitlines BL and BL' are held at 0V to equalize the SRAM internal nodes N1 and N2 at 0V. The control circuit 220 initially sets all the platelines PL1–PL10 to 0V and brings the signals SRAM N ENABLE, SRAM N DISABLE, SRAM P ENABLE and SRAM P DISABLE to VDD to help bias the bitlines BL and BL' and hence the nodes N1 and N2 low. At 235, the signals SRAM N ENABLE and SRAM N DISABLE are brought low and the bitlines BL and BL' are biased high to prevent disturbance to the sensing operation of the SRAM 204 by leakage through the transistors Q7 and Q8. The exemplary control circuit 220 thus operates to selectively provide one of the first plateline signals PL1–PL5 corresponding to a targeted one of the plurality of first ferroelectric capacitors (e.g., PL1 and $C_{FE}1$ in the illustrated example). In this example, the targeted plateline signal PL1 is brought up to VDD after the wordline WL and the signals SRAM N ENABLE and SRAM N DISABLE are brought low.

Further, the control circuit 220 initially provides plateline signals of one value (e.g., PL9 and PL10 at VDD/2 in this example) to some but not all of the second ferroelectric capacitors (e.g., $C_{FE}9$ and $C_{FE}10$) and a plateline signal of a different value (e.g., PL6–PL8 at 0V) to at least one of the remaining second ferroelectric capacitors (e.g., $C_{FE}6$–$C_{FE}8$). This creates a reference voltage at the other internal node (e.g., N2 in this example) using some or all of the second ferroelectric capacitors (e.g., $C_{FE}6$–$C_{FE}10$ in this example). It is noted in the timing diagram 230 at 235, that initially, the non-targeted first platelines PL2–PL5 as well as PL9 and PL10 are brought from 0V up to an intermediate voltage of VDD/2, while PL1 and PL6–PL8 remain low. The second ferroelectric capacitors $C_{FE}6$–$C_{FE}10$ thus operate as a capacitive voltage divider to provide a reference voltage between VDD/2 (PL9 and PL10) and 0V (PL6–PL8) at the internal SRAM node N2. In this manner, the second plateline signals PL6–PL10 and the second plurality 206b of ferroelectric capacitors ($C_{FE}6$–$C_{FE}10$) are employed to generate the SRAM reference voltage for sensing the non-volatile data state of the targeted first ferroelectric capacitor $C_{FE}1$.

It will be appreciated that many different reference voltage values may be obtained in accordance with this aspect of the invention by selectively providing the second plateline signals at different voltage levels (e.g., by providing different plateline signal voltages to different ones of the second ferroelectric capacitors). In addition, the relative sizes of some of the second ferroelectric capacitors $C_{FE}6$–$C_{FE}10$ may be varied to provide further adjustment of the reference voltage value in accordance with the invention. Similarly, where one of the second plurality 206b of ferroelectric capacitors ($C_{FE}6$–$C_{FE}10$) is targeted for a non-volatile read operation, the control circuit 220 selectively provides a corresponding targeted one of the second plateline signals PL6–PL10 and provides at least one but less than all of the first plateline signals PL1–PL5 at a first voltage and provides some or all of the remaining first plateline signals at a different voltage for at least a portion of the non-volatile read operation to provide a reference voltage at the first internal node N1. In this case, the first ferroelectric capacitors $C_{FE}1$–$C_{FE}5$ provide a voltage divider for reference voltage generation at node N1 to read a non-volatile data state from the targeted one of the plurality 106b of second ferroelectric capacitors.

The data from the targeted ferroelectric capacitor $C_{FE}1$ is sensed in the example of FIG. 6A beginning with application of a positive pulse (up to VDD) to the plateline PL1 with PL6–PL8 being brought up to VDD/2. During sensing, the SRAM portion 202 operates as a sense amp to sense the voltage difference between the nodes N1 and N2 created by switching charge from the ferroelectric capacitor $C_{FE}1$ and the reference voltage at node N2. As a result, in the illustrated example, the SRAM internal nodes N1 and N2 are brought high and low, respectively. In this fashion, the non-volatile data state from the ferroelectric capacitor $C_{FE}1$ is read from the non-volatile portion 206 into the volatile SRAM portion 204, which may then be accessed externally through read operations such as 231 in the timing diagram 230. Because the FERAM Read operation at 235 is destructive, an FERAM Write operation (not shown in the timing diagram 230) may be performed after the FERAM READ at 235, generally similar to that illustrated at 233 if the non-volatile data state or bit needs to be retained. Thereafter, the volatile data state in the SRAM portion 204 may be overwritten, as illustrated in a subsequent SRAM Write operation at 236 in the exemplary timing diagram 230 of FIG. 6A.

The invention also provides methods for reading a non-volatile data state from a non-volatile portion of a memory cell, such as the exemplary cell 202 of FIGS. 5A and 5B. In accordance with this aspect of the invention, a plateline signal (e.g., PL1) is provided to a targeted one of the plurality of first ferroelectric capacitors one (e.g., $C_{FE}1$) during a non-volatile read operation to read a non-volatile data state therefrom. A reference voltage is provided to the second internal node (e.g., N2) by selectively providing a first reference plateline signal (e.g., 0V) to at least one of the second ferroelectric capacitors (e.g., $C_{FE}6$–$C_{FE}8$) and providing a second different reference plateline signal (e.g., an intermediate voltage such as VDD/2) to remaining second ferroelectric capacitors (e.g., $C_{FE}9$–$C_{FE}10$) during the non-volatile read operation.

Figure 6B:
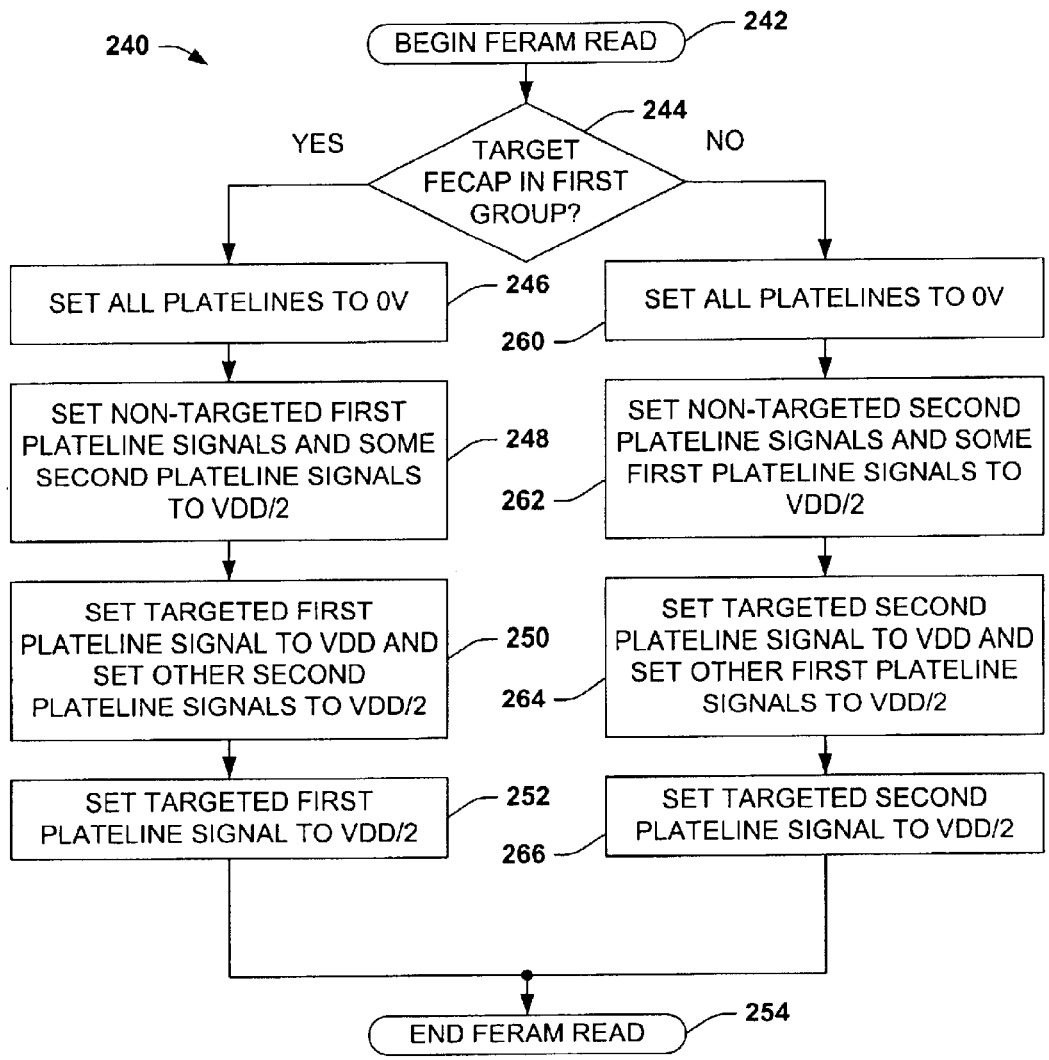
FIG. 6B is a flow diagram illustrating another exemplary method of reading a non-volatile data state from a non-volatile portion of a memory cell into a volatile portion of the memory cell in accordance with the invention.

FIG. 6B illustrates an exemplary method 240 for reading a non-volatile data state from a non-volatile portion of a memory cell in accordance with this aspect of the invention. Beginning at 242, a determination is made at 244 as to whether the target ferroelectric capacitor is in the first group (e.g., 106a) or not (e.g., 106b). If so (e.g., YES at 244), all the plateline signals are set to 0V at 246. Then at 248, the non-targeted first platelines and some of the second plateline signals (e.g., PL2–PL5 and PL–PL10) are set to VDD/2. Thereafter at 250, the targeted first plateline signal (PL1) is brought to VDD and the other second platelines (PL6–PL8) are brought to VDD/2. The targeted first plateline (PL1) is then set to VDD/2 at 252 before the method 240 ends at 254. In the case where one of the second ferroelectric capacitors is targeted for a read operation (NO at 244), all the platelines are set to 0V at 260, after which the non-targeted second plateline signal and some of the first plateline signals are set to VDD/2 at 262. At 264, the targeted second plateline signal is brought to VDD and the other first platelines are brought to VDD/2. The targeted second plateline is then set to VDD/2 at 266 before the method 240 ends at 254.

Figure 5C:
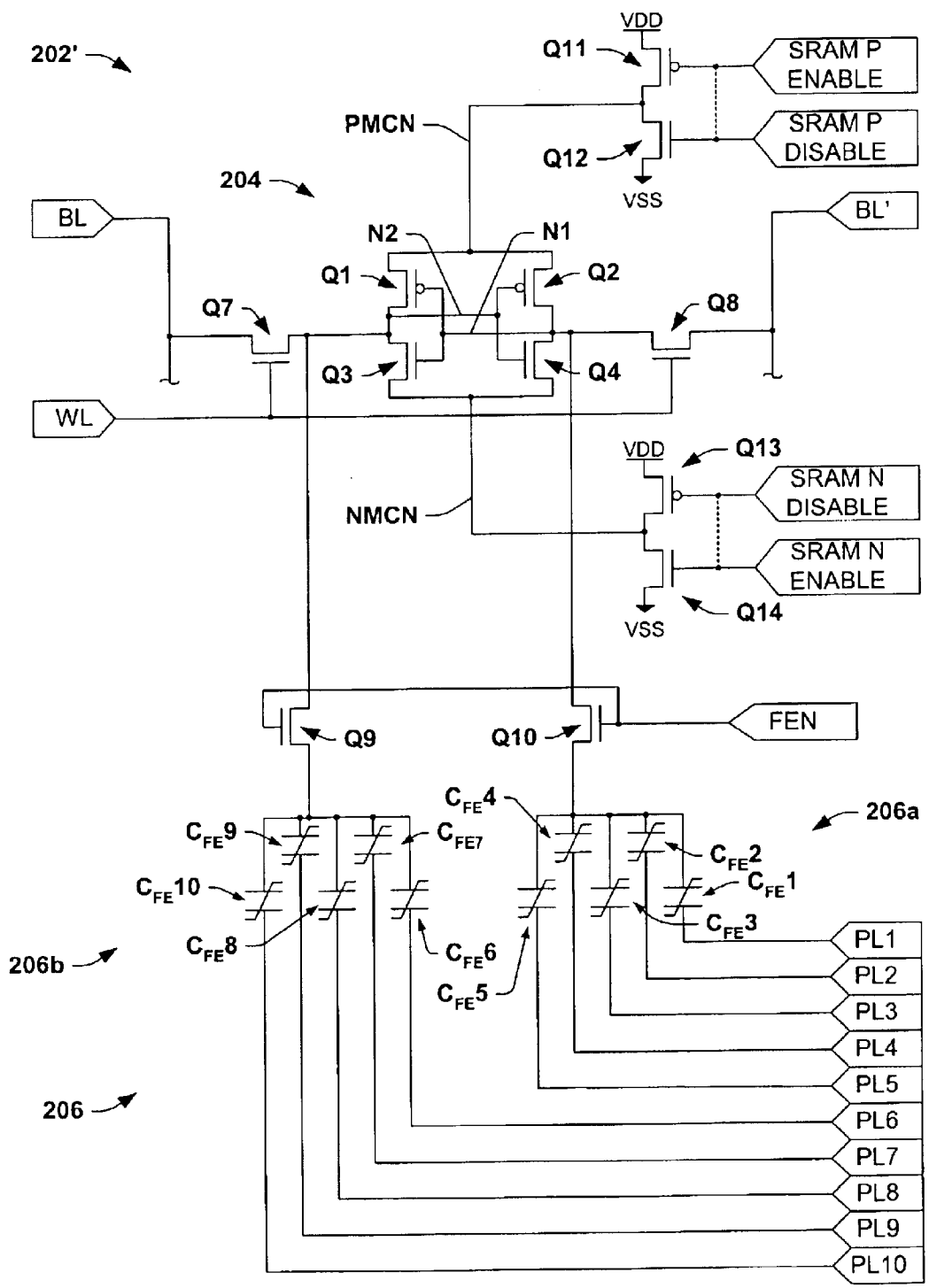
FIG. 5C is a schematic diagram illustrating another exemplary memory cell having NMOS transistors to selectively isolate the volatile and non-volatile portions from one another.

FIG. 5C illustrates another exemplary memory cell 202', wherein the non-volatile portion 206 comprises NMOS transistors Q9 and Q10 to selectively couple or isolate the volatile and non-volatile portions from one another according to a ferroelectric enable control signal FEN (e.g., from the control circuit 220 of FIG. 5B). During SRAM Read and SRAM Write operations (e.g., 231 and 232 in FIG. 6A), the enable signal FEN is held low, whereby the volatile and non-volatile portions 204 and 206 are decoupled from one another. The isolated volatile portion 204 thus operates as a conventional SRAM cell, which is externally accessed via the bitlines BL, BL' and the wordline WL to read and write data into the flip-flop formed by the transistors Q1–Q4. During FERAM Read and FERAM Write operations (e.g., at 235 and 233 in FIG. 6A), the FEN signal is held high to couple the volatile and non-volatile portions 204 and 206.

Figure 7A:
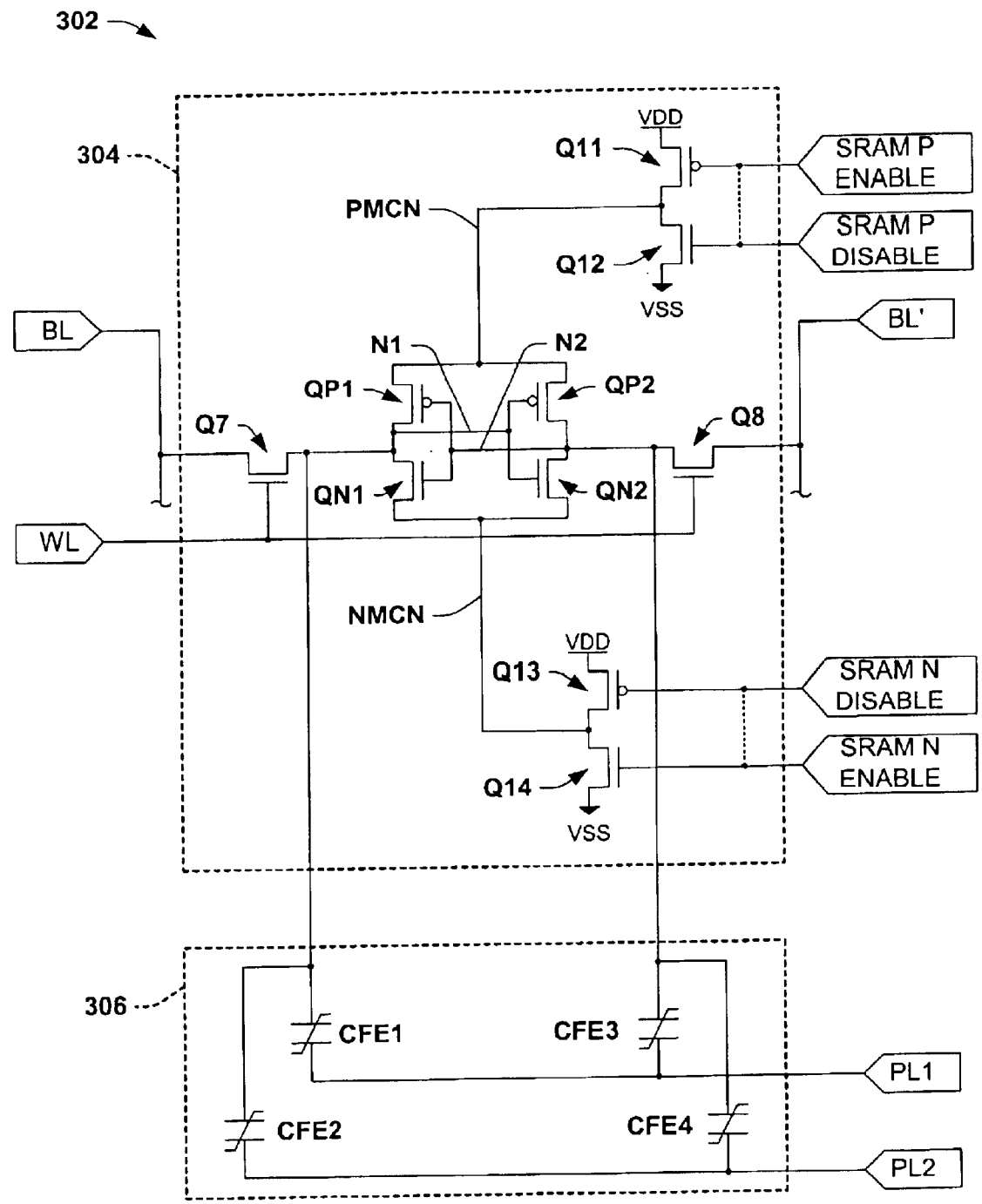
FIGS. 7A and 7B provide a schematic illustration of another exemplary memory cell in accordance with the present invention.
Figure 7B:
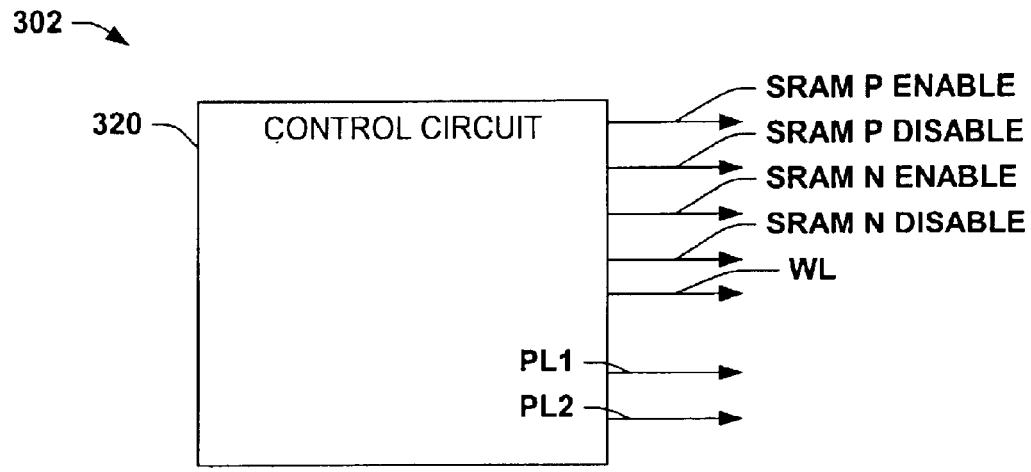
Figure 8:
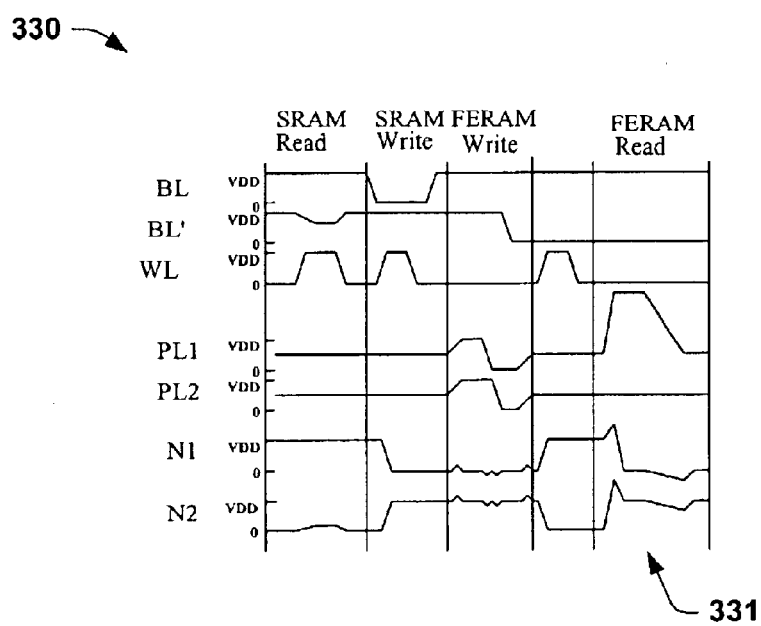
FIG. 8 is a timing diagram illustrating an exemplary operation of the memory cell of FIGS. 7A and 7B.

Referring now to FIGS. 7A, 7B and 8, another aspect of the invention provides methods for reading non-volatile data in a hybrid memory cell, such as the exemplary memory cell 302 in FIGS. 7A and 7B, which allows elimination or reduction of the equalization step before non-volatile read operations. This feature of the invention may be employed in association with the cell 302, which comprises a volatile SRAM memory portion 304 adapted to store a binary volatile data state and a non-volatile (e.g., ferroelectric) memory portion 306 adapted to store a binary non-volatile data state. The SRAM portion 304 comprises a flip-flop formed by two PMOS transistors QP1 and QP2 and two NMOS transistors QN1 and QN2 having internal SRAM nodes N1 and N2. Switching circuits are provided comprising transistors Q11–Q14 to control the upper and lower supply nodes PMCN and NMCN of the SRAM 304 in a manner similar to the volatile SRAM portions described above.

External access to the device 302 is provided by two access transistors Q7 and Q8 coupling the nodes N1 and N2 to complementary bitlines BL and BL', respectively, wherein the gates of the access transistors Q7 and Q8 are coupled to a wordline WL from a control circuit 320 (FIG. 7B). The control circuit 320 provides other timing and control signals in the device 302, including the wordline WL, plateline signals PL1 and PL2, and others, and may be fabricated using any appropriate circuitry for implementing operation of the cell 302 in accordance with the functionality illustrated and described herein. In one exemplary implementation, the control circuit 320 provides timing and control signals for operation of the memory cell 302 generally in accordance with the timing diagram 330 of FIG. 8.

The non-volatile portion 306 comprises first and second ferroelectric capacitors CFE1 and CFE2 coupled with the node N1, as well as third and fourth ferroelectric capacitors CFE3 and CFE4, respectively, coupled with the node N2. The ferroelectric capacitor CFE1 is coupled between the internal node N1 and a first plateline signal PL1 from the control circuit 320, CFE2 is coupled between the node N1 and a second plateline signal PL2, CFE3 is coupled between the node N2 and PL1, and CFE4 is coupled between the node N2 and PL2.

FIG. 8 illustrates a timing diagram 330 showing operation of the cell 302 in accordance with this aspect of the invention, where the bitlines BL and BL' as well as the SRAM internal nodes N1 and N2 remain at their previous states at the start of non-volatile read operations, without the need for precharging or equalization. In the illustrated example, N1 is high (VDD) and N2 is low (0V) at the start of the FERAM Read at 331. During non-volatile read operations, the methods of the invention comprise providing a boosted plateline signal greater than a supply voltage to the first and third ferroelectric capacitors CFE1 and CFE3 using the plateline signal PL1. A second plateline signal PL2 less than the supply voltage is provided to the second and fourth ferroelectric capacitors CFE2 and CFE4 using the control circuit 320. In the illustrated example, the boosted plateline signal PL1 is brought from an intermediate voltage of about VDD/2 to about twice the supply voltage or more during the FERAM Read operation at 331. In addition, the plateline signal PL1 is brought high relatively quickly and subsequently brought back down rather slowly, although other implementations are possible within the scope of the invention, apart from that illustrated in FIG. 8.

The provision of the relatively large plateline signal PL1 extracts more signal charge from the ferroelectric capacitors in a read operation to improve sensing by the SRAM portion 304, even where mismatch exists between the PMOS transistors QP1 and QP2. Thus, whereas conventional bias voltages across the target ferroelectric capacitor may be limited by small load capacitance of the SRAM internal node, application of a boosted plateline voltage pulls the nodes N1 and N2 above the supply voltage VDD. In this case, only the NMOS transistors QN1 and QN2 operate for sensing, thereby avoiding potential mismatch problems associated with the PMOS transistors QP1 and QP2. In addition, the rapid rise of the boosted plateline pulse operates to overcome the previous data state latched in the SRAM portion 304, and a slowly falling boosted plateline pulse operates to minimize data state flipping. As with the above examples, the FERAM Read operation at 331 is destructive, wherein an FERAM Write operation (not shown in the timing diagram 330) may be performed after the FERAM READ at 331 if the non-volatile data state is to be retained.

Figure 7C:
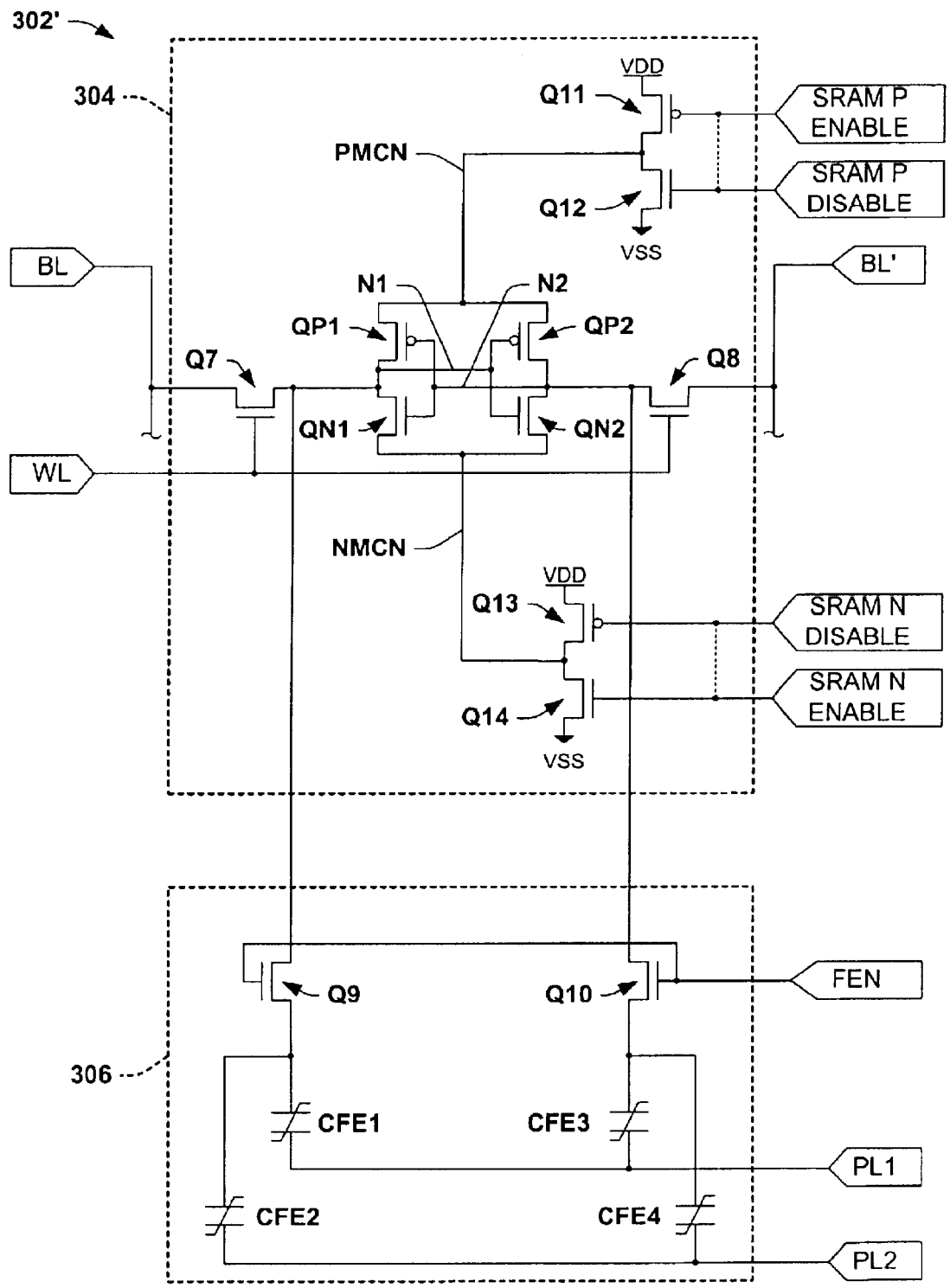
FIG. 7C is a schematic diagram illustrating another exemplary memory cell having NMOS transistors to selectively isolate the volatile and non-volatile portions from one another.

FIG. 7C illustrates another exemplary memory cell 302', wherein the non-volatile portion 306 comprises NMOS transistors Q9 and Q10 to selectively couple or isolate the volatile and non-volatile portions from one another according to a ferroelectric enable control signal FEN (e.g., from the control circuit 320 of FIG. 7B). During SRAM Read and SRAM Write operations (e.g., FIG. 8 above), the enable signal FEN is held low, whereby the volatile and non-volatile portions 304 and 306 are decoupled from one another. The isolated volatile portion 304 thus operates as a conventional SRAM cell, which is externally accessed via the bitlines BL, BL' and the wordline WL to read and write data into the flip-flop formed by the transistors Q1–Q4. During FERAM Read and FERAM Write operations (e.g., FIG. 8), the FEN signal is held high to couple the volatile and non-volatile portions 304 and 306.

Figure 9A:
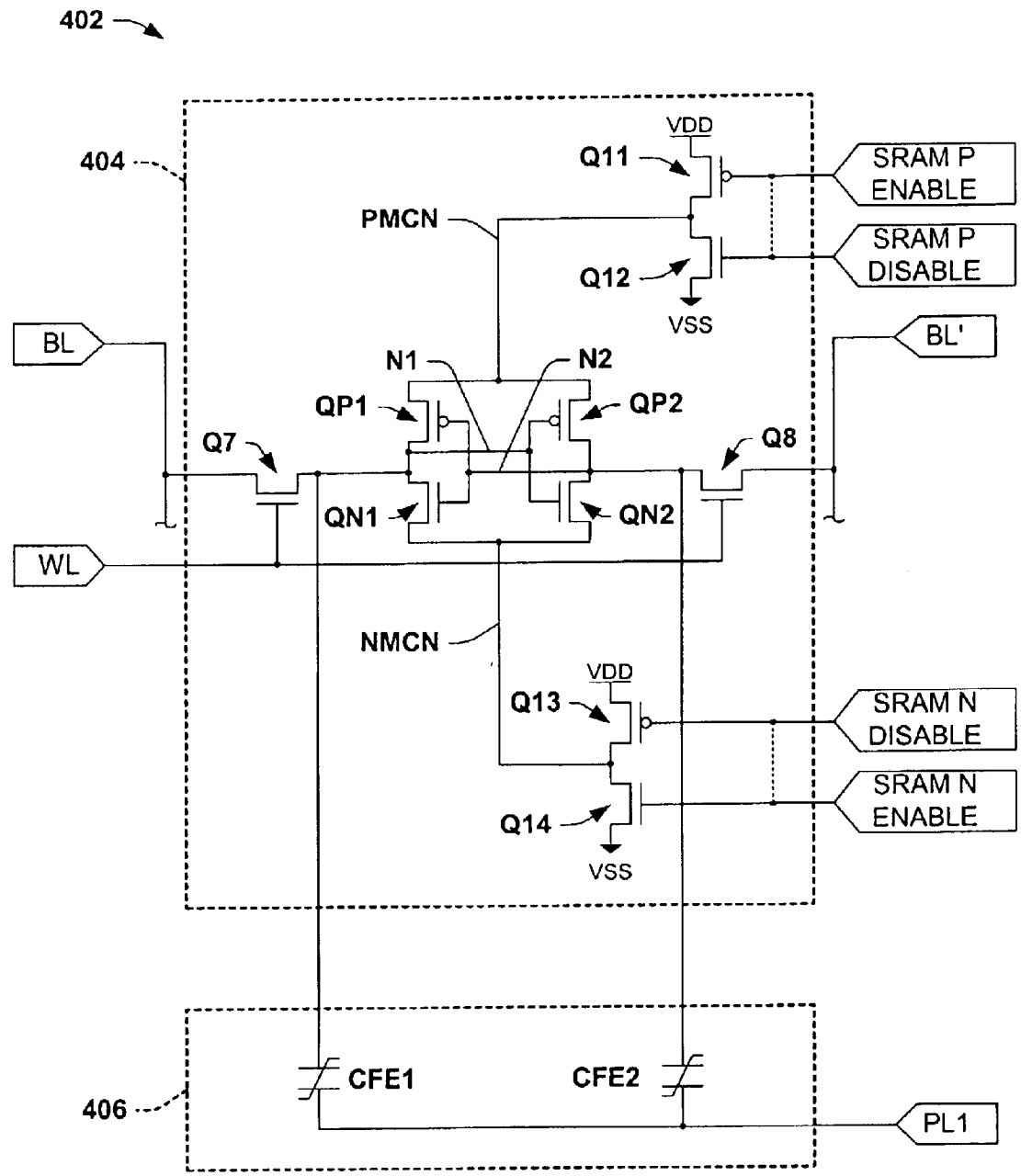
FIGS. 9A and 9B provide a schematic illustration of another exemplary memory cell in accordance with the present invention.
Figure 9B:
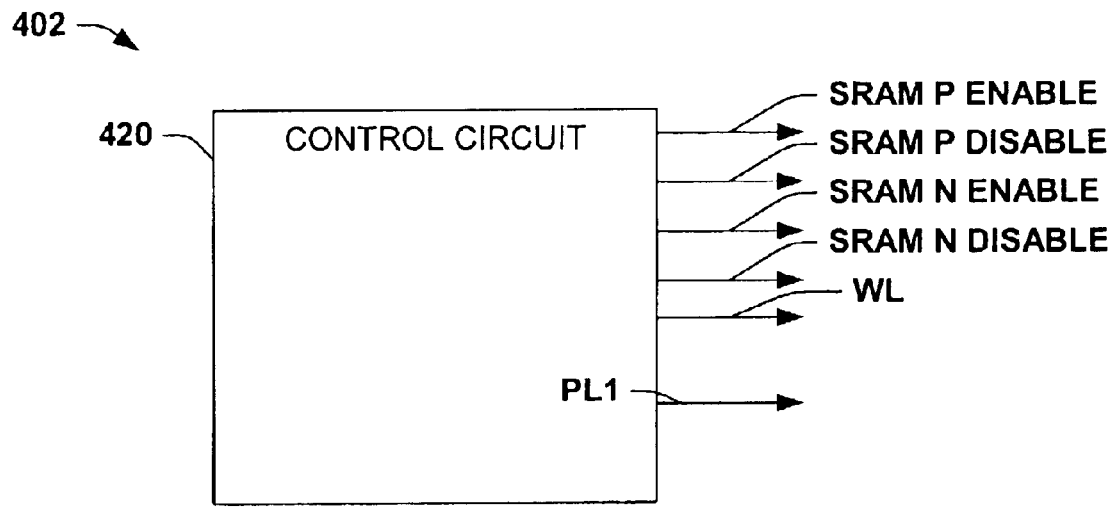
Figure 10:
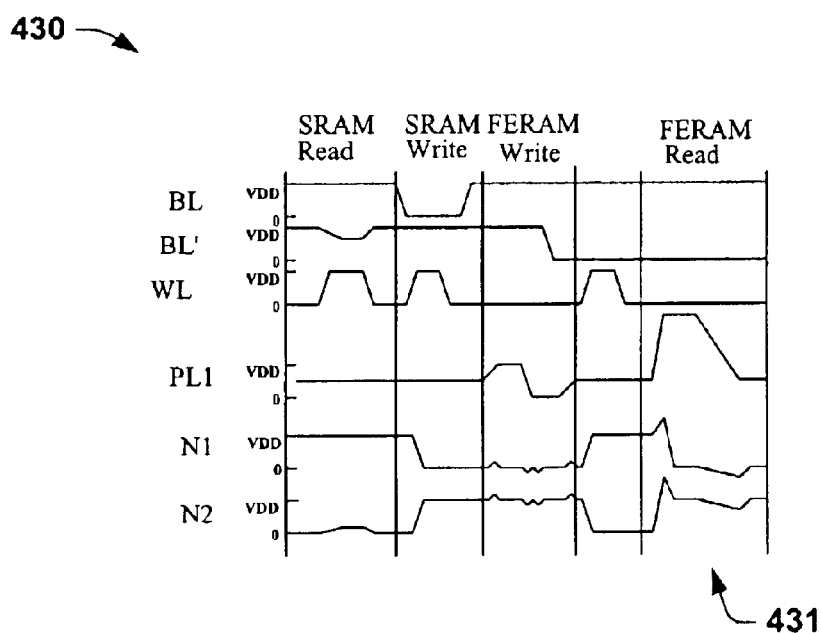
FIG. 10 is a timing diagram illustrating an exemplary operation of the memory cell of FIGS. 9A and 9B.

Referring now to FIGS. 9A, 9B and 10, another aspect of the invention provides methods for reading non-volatile data in a hybrid memory cell, such as the exemplary memory cell 402 in FIGS. 9A and 9B. This aspect also allows or facilitates shortening or elimination of precharging or equalization operations prior to non-volatile data read operations. The illustrated hybrid memory cell 402 comprises a volatile SRAM portion 404 similar in most respects to the SRAM portion 304 illustrated and described above in FIG. 7A, and operates to store a binary volatile data state. The cell 402 further includes a non-volatile portion 406 for storing a binary non-volatile data state, comprising a first ferroelectric capacitor CFE1 coupled with a first internal node N1 of the volatile portion 404, and a second ferroelectric capacitor CFE2 coupled with a second internal node N2. The ferroelectric capacitor CFE1 is coupled between the internal node N1 and a plateline signal PL1 from a control circuit 420 and CFE2 is coupled between the node N2 and PL1.

FIG. 10 provides a timing diagram 430 illustrating exemplary operation of the cell 404 in accordance with this aspect of the invention. In the FERAM Read operation at 431, a boosted plateline signal greater than a supply voltage is provided to the first and second ferroelectric capacitors via the plateline signal PL1 from the control circuit 420. The control circuit 420 provides other timing and control signals in the device 402, including the wordline WL, plateline signal PL1, and others, and may be fabricated using any appropriate circuitry for implementing operation of the cell 402 in accordance with the functionality illustrated and described herein. In one exemplary implementation, the control circuit 420 provides timing and control signals for operation of the memory cell 402 generally in accordance with the timing diagram 430 of FIG. 10, wherein the plateline signal PL1 is about twice the supply voltage or more. The provision of the relatively large plateline pulse extracts more signal charge from the ferroelectric capacitors in a read operation to improve sensing by the SRAM portion 404, even where mismatch exists between the PMOS transistors QP1 and QP2. Since the FERAM Read operation at 431 is destructive, an FERAM Write operation (not shown in the timing diagram 430) may be performed after the FERAM READ at 431 for retaining the non-volatile data state.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A memory cell for storing data in a semiconductor device, the memory cell comprising:
   a volatile portion adapted to store a binary volatile data state, wherein the volatile portion comprises first and second internal nodes:
   a non-volatile portion coupled with the volatile portion, the non-volatile portion being adapted to store two or more binary non-volatile data states, wherein the non-volatile portion comprises a plurality of first ferroelectric capacitors coupled with the first internal node of the volatile portion and a plurality of second ferroelectric capacitors coupled with the second internal node of the volatile portion: and
   a control circuit coupled with the volatile and non-volatile portions and providing a plurality of plateline signals to the non-volatile portion, wherein the non-volatile portion comprises a plurality of ferroelectric capacitor pairs, the ferroelectric capacitor pairs being individually operable to store a binary non-volatile data state and individually comprising one of the plurality of first ferroelectric capacitors and one of the plurality of second ferroelectric capacitors, and wherein the plateline signals are individually coupled with one of the ferroelectric capacitor pairs.

2. The memory cell of claim 1, wherein the plurality of first ferroelectric capacitors are individually coupled between the first internal node and individual ones of the plateline signals, and the plurality of second ferroelectric capacitors are individually coupled between the second internal node and individual ones of the plateline signals.

3. The memory cell of claim 1, wherein the control circuit selectively provides the plateline signals to the non-volatile portion according to a particular non-volatile data state being accessed during a non-volatile read or write operation.

4. The memory cell of claim 3, wherein the control circuit selectively provides a boosted plateline signal to a targeted one of the ferroelectric capacitors during a non-volatile read operation to read a non-volatile data state from the targeted one of the ferroelectric capacitors, the boosted plateline signal being greater than a supply voltage.

5. The memory cell of claim 4, wherein the control circuit selectively provides zero volt plateline signals to non-targeted ferroelectric capacitors while providing the boosted plateline signal to the targeted one of the ferroelectric capacitors during the non-volatile read.

6. A memory cell for storing data in a semiconductor device, the memory cell comprising:
- a volatile portion adapted to store a binary volatile data state, wherein the volatile portion comprises first and second internal nodes;
- a non-volatile portion coupled with the volatile portion, the non-volatile portion being adapted to store two or more binary non-volatile data states, wherein the non-volatile portion comprises a plurality of first ferroelectric capacitors coupled with the first internal node of the volatile portion and a plurality of second ferroelectric capacitors coupled with the second internal node of the volatile portion; and
- a control circuit coupled with the volatile and non-volatile portions, the control circuit providing a plurality of first plateline signals to the plurality of first ferroelectric capacitors and a plurality of second plateline signals to the plurality of second ferroelectric capacitors, wherein the ferroelectric capacitors are individually operable to store a binary non-volatile data state, wherein the plurality of first ferroelectric capacitors are individually coupled between the first internal node and individual ones of the first plateline signals, and wherein the plurality of second ferroelectric capacitors are individually coupled between the second internal node and individual ones of the second plateline signals.

7. The memory cell of claim 6, wherein the control circuit selectively provides the first and second plateline signals to the non-volatile portion according to a particular non-volatile data state being accessed during a non-volatile read or write operation.

8. The memory cell of claim 6, wherein the control circuit selectively provides one of the first plateline signals corresponding to a targeted one of the plurality of first ferroelectric capacitors and provides at least one of the second plateline signals at a first voltage and provides another of the second plateline signals at a different voltage to provide a reference voltage at the second internal node during a non-volatile read operation to read a non-volatile data state from the targeted one of the plurality of first ferroelectric capacitors, and wherein the control circuit selectively provides one of the second plateline signals corresponding to a targeted one of the plurality of second ferroelectric capacitors and provides at least one of the first plateline signals at the first voltage and provides another of the first plateline signals at a different voltage to provide a reference voltage at the first internal node during a non-volatile read operation to read a non-volatile data state from the targeted one of the plurality of second ferroelectric capacitors.

* * * * *